US011060312B1

(12) United States Patent
Hill et al.

(10) Patent No.: US 11,060,312 B1
(45) Date of Patent: Jul. 13, 2021

(54) DATA CENTER NETWORK TUNNEL

(71) Applicant: Amazon Technologies, Inc., Seattle, WA (US)

(72) Inventors: Mark A. Hill, Ballsbridge (IE); Gerard Joseph Banks, Raheny (IE)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/404,117

(22) Filed: May 6, 2019

(51) Int. Cl.
| | |
|---|---|
| *E04H 5/06* | (2006.01) |
| *H05K 7/20* | (2006.01) |
| *H05K 7/14* | (2006.01) |
| *E04B 1/348* | (2006.01) |
| *E04B 1/00* | (2006.01) |
| *E04H 5/00* | (2006.01) |

(52) U.S. Cl.
CPC .............. *E04H 5/06* (2013.01); *E04B 1/0015* (2013.01); *E04B 1/34815* (2013.01); *H05K 7/1497* (2013.01); *H05K 7/20745* (2013.01); *E04B 2001/34892* (2013.01); *E04H 2005/005* (2013.01)

(58) Field of Classification Search
CPC .............. E04B 1/0015; E04B 1/34815; E04B 2001/34892; E04H 5/06; E04H 2005/005; H05K 7/1497; H05K 7/20745
See application file for complete search history.

(56) References Cited

U.S. PATENT DOCUMENTS

| | | | | |
|---|---|---|---|---|
| 4,009,579 | A * | 3/1977 | Patzner | E21D 9/005 405/138 |
| 7,509,096 | B2 * | 3/2009 | Palm | H04W 64/00 370/338 |
| 7,606,963 | B2 * | 10/2009 | Merlet | H04L 12/2838 370/466 |
| 7,685,323 | B1 * | 3/2010 | Moore | H05K 7/20836 710/8 |
| 9,357,681 | B2 * | 5/2016 | Ross | H05K 7/20736 |
| 9,439,331 | B1 * | 9/2016 | Wu | H05K 7/20772 |
| 9,445,531 | B1 * | 9/2016 | Heydari | H05K 7/20827 |
| 9,585,282 | B1 * | 2/2017 | Gandhi | H05K 7/1494 |
| 9,593,876 | B2 * | 3/2017 | Smith | H05K 7/20236 |
| 9,606,316 | B1 | 3/2017 | Gandhi | |
| 9,681,588 | B1 * | 6/2017 | Eichelberg | H05K 7/20145 |
| 9,690,337 | B1 * | 6/2017 | Eichelberg | H05K 7/20709 |
| 9,983,248 | B1 * | 5/2018 | Ramirez | H04B 3/00 |

(Continued)

OTHER PUBLICATIONS

U.S. Appl. No. 16/368,713, filed Apr. 11, 2019, Mayankant Madhavkant.

(Continued)

*Primary Examiner* — James M Ference
(74) *Attorney, Agent, or Firm* — Robert C. Kowert; Kowert, Hood, Munyon, Rankin & Goetzel, P.C.

(57) ABSTRACT

An underground networking tunnel may be installed at a data center construction site prior to completion of a data center being constructed at the data center construction site. Networking equipment in the underground networking tunnel may be configured and commissioned concurrently with construction of the data center. Also data center power and cooling systems may service the underground networking subsequent to construction of a data center above the underground networking tunnel.

21 Claims, 16 Drawing Sheets

(56) References Cited

U.S. PATENT DOCUMENTS

| | | | |
|---|---|---|---|
| 10,061,097 B2 | 8/2018 | Morales et al. | |
| 10,088,818 B1* | 10/2018 | Mathews | H04L 12/2825 |
| 2003/0112965 A1* | 6/2003 | McNamara | H04M 1/0293 |
| | | | 379/399.01 |
| 2005/0225936 A1* | 10/2005 | Day | H05K 7/20754 |
| | | | 361/679.47 |
| 2005/0235671 A1* | 10/2005 | Belady | F24F 3/06 |
| | | | 62/259.2 |
| 2006/0065000 A1* | 3/2006 | Belady | H05K 7/2079 |
| | | | 62/259.2 |
| 2008/0076383 A1* | 3/2008 | Barrett | E21F 17/18 |
| | | | 455/404.1 |
| 2009/0283386 A1* | 11/2009 | Diluoffo | H05K 7/20709 |
| | | | 198/468.8 |
| 2010/0251629 A1* | 10/2010 | Clidaras | H05K 7/20754 |
| | | | 52/79.1 |
| 2010/0310221 A1* | 12/2010 | Le Dissez | H04Q 11/0005 |
| | | | 385/135 |
| 2011/0038633 A1* | 2/2011 | DeCusatis | H04J 14/02 |
| | | | 398/79 |
| 2011/0038634 A1* | 2/2011 | DeCusatis | H04J 14/0287 |
| | | | 398/79 |
| 2011/0040896 A1* | 2/2011 | DeCusatis | H04J 14/0254 |
| | | | 709/249 |
| 2011/0063792 A1* | 3/2011 | Schmidt | G06F 1/20 |
| | | | 361/679.46 |
| 2011/0227344 A1* | 9/2011 | Hatton | H02J 3/381 |
| | | | 290/52 |
| 2011/0232209 A1* | 9/2011 | Boersema | F24F 11/0001 |
| | | | 52/173.1 |
| 2012/0167600 A1* | 7/2012 | Dunnavant | H05K 7/20836 |
| | | | 62/89 |
| 2012/0167610 A1* | 7/2012 | Dunnavant | F28C 1/16 |
| | | | 62/314 |
| 2012/0168119 A1* | 7/2012 | Dunnavant | H05K 7/20745 |
| | | | 165/59 |
| 2012/0170196 A1* | 7/2012 | Yuan | H05K 7/20745 |
| | | | 361/679.5 |
| 2014/0345207 A1* | 11/2014 | Gliessman | E04D 13/0325 |
| | | | 52/80.1 |
| 2015/0009621 A1* | 1/2015 | Baldinger | H05K 7/20781 |
| | | | 361/679.47 |
| 2015/0331467 A1* | 11/2015 | Kaplan | G06F 1/30 |
| | | | 713/300 |
| 2015/0373882 A1* | 12/2015 | Smith | H05K 7/20809 |
| | | | 361/679.46 |
| 2016/0006300 A1* | 1/2016 | Grujovski | H02J 13/00034 |
| | | | 307/64 |
| 2016/0020858 A1* | 1/2016 | Sipes, Jr. | H04B 10/077 |
| | | | 398/45 |
| 2016/0057894 A1* | 2/2016 | Chen | H05K 7/1497 |
| | | | 361/679.47 |
| 2016/0073181 A1* | 3/2016 | Abbiati | H04Q 11/0067 |
| | | | 398/45 |
| 2016/0132031 A1* | 5/2016 | Kozura | H04L 12/2816 |
| | | | 700/275 |
| 2016/0135318 A1* | 5/2016 | Dean | G06F 12/14 |
| | | | 361/679.33 |
| 2016/0225248 A1* | 8/2016 | Rodriguez, Jr. | H04B 1/38 |
| 2016/0345461 A1* | 11/2016 | Smith | H05K 7/20818 |
| 2017/0064876 A1* | 3/2017 | Leckelt | H05K 7/20754 |
| 2017/0117971 A1* | 4/2017 | Sipes, Jr. | G02B 6/4246 |
| 2017/0127156 A1* | 5/2017 | Rodriguez, Jr. | H04B 1/40 |
| 2017/0127556 A1* | 5/2017 | Smith | H05K 5/068 |
| 2018/0027430 A1* | 1/2018 | Pasulka | H04W 88/085 |
| | | | 370/221 |
| 2018/0069932 A1* | 3/2018 | Tiwari | G01S 5/0252 |
| 2018/0120793 A1* | 5/2018 | Tiwari | G06Q 10/06 |
| 2018/0121571 A1* | 5/2018 | Tiwari | G08B 25/14 |
| 2019/0072918 A1* | 3/2019 | Martin | H04L 12/283 |
| 2019/0364698 A1* | 11/2019 | Johnson | E04H 5/02 |

OTHER PUBLICATIONS

U.S. Appl. No. 16/218,328, filed Dec. 12, 2018, Peter George Ross et al.

* cited by examiner

DATA CENTER NETWORK TUNNEL

BACKGROUND

Organizations such as on-line retailers, Internet service providers, search providers, financial institutions, universities, and other computing-intensive organizations often conduct computer operations from large scale computing facilities. Also, such organizations, or smaller organizations, may outsource computer operations to a computing or storage service provider that operates large scale computing facilities. Such large scale computing facilities house and accommodate a large amount of server, network, and additional computer equipment to process, store, and exchange data. Typically, a computer room of a computing facility includes many server racks organized into rows with aisles between the rows of server racks. Each server rack, in turn, includes many servers and/or other associated computer equipment.

The amount of computing capacity needed for any given facility, such as a data center, may change rapidly as business needs dictate. Most often, there is a need for increased capacity at a data center location, or a need for new data center locations. Initially providing computing or storage capacity in a facility, such as a data center, is resource-intensive and may take many months to implement. Substantial amounts of time and skilled labor are typically required to design, build, and commission data centers. Typically, data center networks are configured, connected to external networks, and commissioned after construction of the data center is complete. Configuring the networks, connecting the networks to external networks, and commissioning the networks of a new facility, such as a data center, may involve several weeks or months of work after construction of the facility is complete. The amount of time required for configuring, connecting, and commissioning the network may delay making compute, storage, or other resources of the new facility available to service customers of the facility, such as customers of a provider network that operates a new data center being constructed.

Figure 1A:
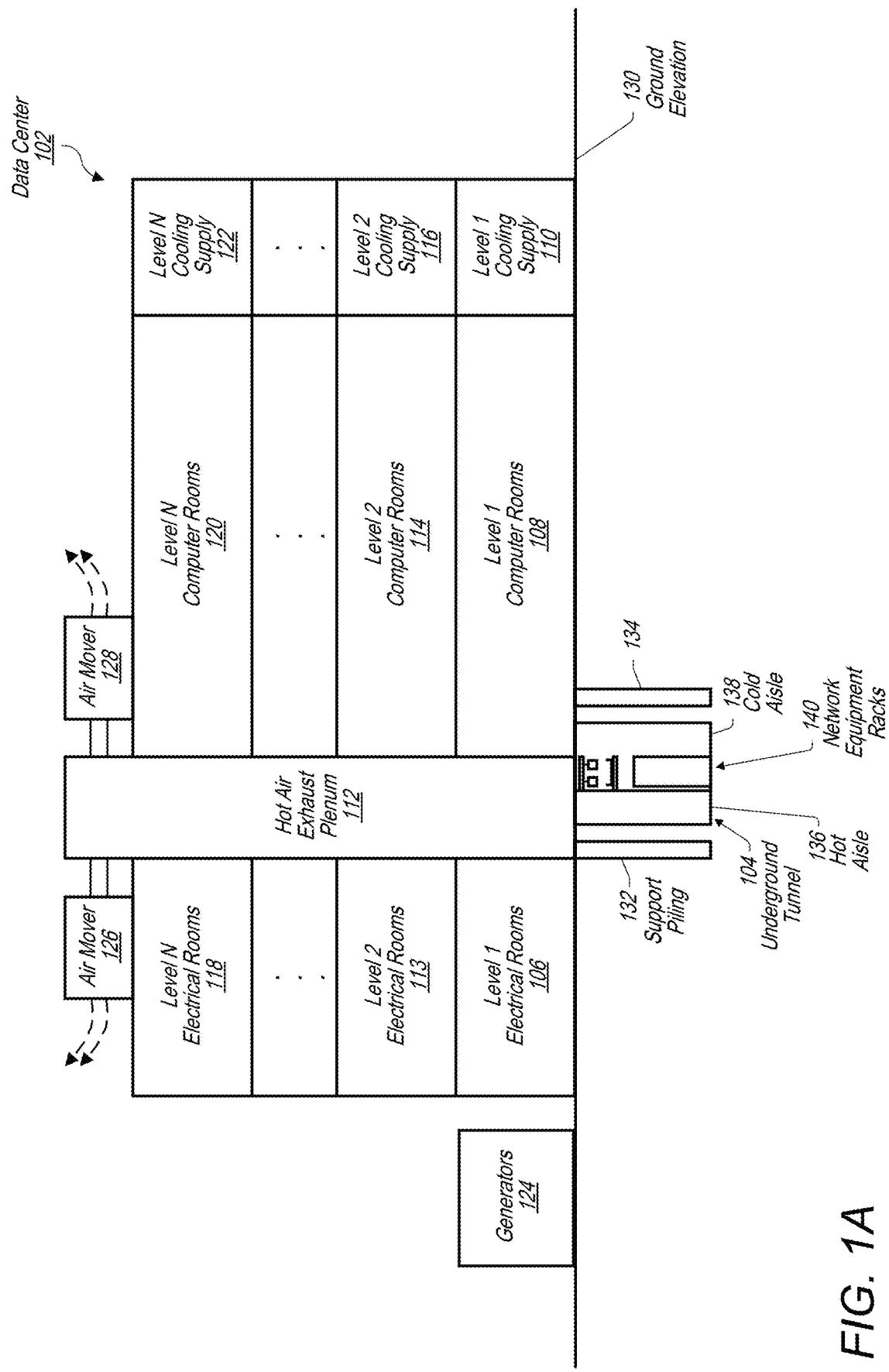
FIG. 1A illustrates a side view of a data center and an underground networking tunnel, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of an underground networking tunnel for a data center are disclosed. Also methods of installing an underground networking tunnel and commissioning a network in an underground networking tunnel while a data center is being built above the underground networking tunnel are disclosed.

According to some embodiments, a method of commissioning a network at a data center includes installing a tunnel structure at an elevation below a ground elevation of a data center building that is to be constructed at a data center location, installing networking equipment in the tunnel structure before or while the data center building is being constructed above the tunnel structure at the data center location, and commissioning the networking equipment installed in the tunnel structure to provide a local network backbone for computer rooms of the data center building being constructed above the tunnel structure, wherein at least a portion of the commissioning is performed before the computer rooms of the data center building are commissioned.

For example, a below grade trench may be dug at a site where a data center is to be built. Pre-fabricated concrete tunnel structures may be placed in the trench and connected together. Continuing the example, modular infrastructure frames may be installed in the connected tunnel structure or may be included in the tunnel structures when installed. The modular infrastructure frames may be installed with segments of one or more infrastructure systems coupled to the modular infrastructure frames. For example the segments may include one or more power busways, cable trays, fire alarm systems, very early smoke detection alarm systems (VESDA systems), building management systems, air containment systems, etc. The segments may be coupled to the modular infrastructure frames when installed or after installation. Continuing the example, a top cover may be placed on the tunnel structures and the trench may be filled with a filler material, such as dirt or sand. Ends of the tunnel structure may remain open or include doors that open to an external environment external to the underground networking tunnel and external to a data center that is being built over the underground networking tunnel. Continuing the example, network equipment may be installed in the underground networking tunnel while construction of a data center proceeds above the underground networking tunnel. Also, the installed networking equipment may be commissioned and integrated into a larger network, such as a provider network, while construction of a data center proceeds above the underground networking tunnel.

In some embodiments, the underground networking tunnel may form a local backbone network for a data center being built above the underground networking tunnel. For example, the underground networking tunnel may connect computing devices in multiple computer rooms of a data center to one another and to a provider network of an operator of the data center via cables that run from the computer rooms to the networking equipment in the underground networking tunnel.

In some embodiments, installing and commissioning networking equipment in an underground networking tunnel may allow for parallel work paths, such that network installation and commissioning is performed in parallel with construction activities and other activities related to commissioning computer rooms of a data center being built above the underground networking tunnel. In some embodiments, a local backbone network for a data center implemented via network equipment in an underground networking tunnel may be ready to allow customers to access computing or storage devices installed in the computer rooms of the data center upon installation of the computing or storage devices in the computer rooms, and without waiting for network configuration operations to be performed to implement a network for the computing or storage devices. This may significantly reduce an amount of time between when construction of a new data center site begins and when customers are first able to access compute, storage, or other resources of the data center.

According to some embodiments, a method includes installing a tunnel structure at a data center location where a data center is to be constructed and initiating commissioning of network equipment installed in the tunnel structure prior to completion of construction of the data center, wherein the data center is being constructed above the tunnel structure.

According to some embodiments, a data center facility includes a data center building comprising a plurality of computer rooms, a tunnel structure extending below the data center building, and network equipment installed in the tunnel structure, wherein the network equipment installed in the tunnel structure forms a local network backbone for the plurality of computer rooms.

As used herein, an "aisle" means a space next to one or more racks, such as a space between a row of racks and a wall of a tunnel structure. An "aisle" may be a "hot aisle" that encompasses a space between a wall and a row of racks that receives air that has been heated by heat producing components of computing devices in the row of racks, such as rack mounted computing systems. Also, an aisle may be a "cold aisle" that encompasses a space between a wall and a row of racks that is provided cool air to be passed through computing devices in the row of racks to remove heat from heat producing components in the computing devices. Also, an aisle may be a space or walkway in a data center or underground tunnel structure that connects other aisles, such as an aisle running perpendicular to a plurality of cold aisles. In some embodiments, an aisle may be between rows of racks in a computer room or between a row of racks in a computer room and a wall of a data center, such as a first or last aisle of a set of aisles in a computer room.

As used herein, "computing system" includes any of various computer systems or components thereof. One example of a computing system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). As used herein a "computing system" may also refer to data storage systems, such as storage servers, as well as networking systems, such as routers, switches, etc.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, a "module" or "modular" component is a component or a combination of components physically coupled to one another. A module or modular component may include functional elements and systems, such as power distribution systems, networking systems, fire suppression systems, and/or control systems, as well as structural elements, such a frame, housing, structure, container, etc. In some embodiments, a module is pre-assembled at a location off-site from a data center location.

Typically, data center construction and commissioning is performed sequentially where a data center building is first constructed, and subsequently networking equipment, computing equipment, etc. is installed in the completed data center building and commissioned. When data centers are constructed and commissioned in this way, a significant amount of time, such as months, may elapse between when construction of the data center building is complete and when customers of the data center are able to access services of the data center, such as computing services, data storage services, etc. Often a significant amount of the time between construction completion and customer availability is spent configuring, commissioning, and testing a network for the data center.

In some embodiments, a timeline from the beginning of construction of a data center to customer availability for resources of the data center may be shortened by installing an underground networking tunnel at a data center site and configuring, commissioning, and testing a network for the data center in parallel with other construction and commissioning activities, such as building a data center building, installing data center infrastructure systems in the data center building (e.g. power systems, cooling systems, building management systems, etc.), and installing computing or data storage devices in the data center building.

Also, in some embodiments, an underground networking tunnel may move networking equipment out of computer rooms of a data center and free up space in the computer rooms for installation of additional computing or data storage devices that provide resources for customers of the data center. Additionally, an underground networking tunnel may span a length or width of a data center and may provide connection points to a data center network throughout the data center and minimize lengths of cable or fiber that need to be run to connect computing devices, data storage devices, or computer rooms to a network of the data center. In some embodiments, an underground networking tunnel may span a fractional portion of a length or width of a data center. For example, in some embodiments, while not spanning a full length or width of a data center, the underground networking tunnel may span a substantial portion of a length or width of the data center, such as two-thirds of the length or width, one-half the length or width, etc.

FIG. 1A illustrates a side view of a data center and an underground networking tunnel, according to some embodiments.

In some embodiments, a data center, such as data center 102, may include a plurality of electrical rooms, computer rooms, and cooling supply rooms. Also, in some embodiments, a data center may include a single level of electrical rooms, computer rooms, and cooling supply rooms, or may include multiple levels of electrical rooms, computer rooms, and cooling supply rooms. For example, data center 102 includes level 1 electrical rooms 106, level 1 computer rooms 108, level 1 cooling supply rooms 110, level 2 electrical rooms 113, level 2 computer rooms 114, and level 2 cooling supply rooms 116. Additionally, a data center, such as data center 102, may include any number of additional levels, for example data center 102 as illustrated in FIG. 1A includes level N electrical rooms 118, level N computer rooms 120, and level N cooling supply rooms 122, where "N" could be any number of levels. Also data center 102 includes generators 124 that provide back-up power to level 1 through level N electrical rooms.

In some embodiments, a data center, such as data center 102, may include a vertical hot air exhaust plenum and air movers mounted on a roof of the data center. For example, data center 102 includes hot air exhaust plenum 112 and air movers 126 and 128. In some embodiments, outside air may be drawn into cooling supply rooms, such as cooling supply rooms 110, 116, and 122. The outside air may be filtered, and depending on ambient conditions, the outside air may be directed to cold aisles in the computer rooms of the data center, such as computer rooms 108, 114, and 120 without additional cooling. This may be referred to as "free-cooling." Or, depending on ambient conditions, the outside air may be cooled via a direct evaporative cooler, indirect evaporative cooler, a mechanical chiller, or other type of cooling system and may be directed to cold aisles in the computer rooms of the data center, such as computer rooms 108, 114, and 120. In some embodiments, a chilled fluid, such as chilled water, may be circulated from a cooling supply room to computer rooms of the data center. Air may be passed across cooling coils in which the chilled fluid flows. In some embodiments, air that has been heated by removing waste heat from heat producing components of computing devices or data storage devices in the computer rooms may be exhausted into a vertical hot air exhaust plenum, such as hot air exhaust plenum 112. Air moving devices, such as fans or blowers, may create a pressure gradient in the hot air exhaust plenum that draws exhaust air out of the computer rooms, into the exhaust air plenum, up vertically through the exhaust air plenum, and out into an external environment, external to the data center. For example, air movers 126 and 128 may draw exhaust air out of exhaust air plenums in level 1 computer rooms 108, level 2 computer rooms 114, and level N computer rooms 120.

In addition, an underground networking tunnel, such as underground tunnel 104, may be located below a data center, such as data center 102. For example, underground tunnel 104 is located below data center 102 which has been built above and over underground tunnel 104. Additionally, in some embodiments, an underground networking tunnel, such as underground tunnel 104, may be located below a ground elevation at a data center site. For example, underground tunnel 104 is below ground elevation 130. However, depending upon the topology of a data center site a portion of an underground networking tunnel, such as underground tunnel 104, may be above a ground elevation at the data center site. For example, if a data center site has a sloping ground surface, such as a hill, cliff, mountain, etc. a portion of an underground networking tunnel at the data center site may be above a low point of the sloping ground surface, but below other higher points of the sloping ground surface.

In some embodiments, an underground networking tunnel, such as underground tunnel 104, may be installed prior to construction of a data center above the underground networking tunnel, such as data center 102 built above underground tunnel 104.

In some embodiments, an underground networking tunnel, such as underground tunnel 104, may include network equipment racks, such as network equipment racks 140. In some embodiments, the network equipment racks may house servers, routers, switches, computing devices, data storage devices, and/or other components that implement a network for a data center, such as data center 102, and that connect the data center to a larger network, such as a provider network of an operator of a data center, such as an operator of data center 102.

In some embodiments, networking equipment, such as servers, routers, switches, computing devices, data storage devices, etc. may be installed in network equipment racks in an underground networking tunnel prior to completion of a data center being constructed above the underground networking tunnel. For example, network equipment racks 140 may be installed in underground tunnel 104 prior to completion of construction of data center 102. Additionally, the servers, routers, switches, computing devices, data storage devices, etc. may be configured to provide a local network backbone for a data center, such as data center 102, and may be commissioned prior to completion of construction of a data center being constructed above the underground networking tunnel, or in parallel with installation and configuration of computing or data storage devices in computer rooms of a data center being constructed above the underground networking tunnel.

In some embodiments, configuring or commissioning computer rooms of a data center may include installing power, cooling, building management, and/or other infrastructure systems in the computer rooms and installing computing and/or data storage device in racks of the computer rooms. In some embodiments, these tasks may be performed at the same time a network for the data center is being commissioned in an underground networking tunnel extending along a width or length of the data center, below the data center.

As can be seen in FIG. 1A, in some embodiments, locating networking equipment, such as network equipment racks 140, into an underground tunnel structure, such as underground tunnel 104, may move the network equipment out of an above ground footprint of the data center such that more space in the data center is available to house computing or data storage devices that provide resources to customers of the data center.

In some embodiments, one or more vertical columns may be installed on either side of a tunnel structure of an underground networking tunnel to support a weight of a portion of a data center constructed above the underground networking tunnel. In some embodiments, the columns may be concrete pilings, piers, or other type of structural supports. In some embodiments, the columns may be steel beams or may be made of another material. For example, support pilings 132 and 134 are located on either side of underground tunnel 104 and support a portion of a foundation of data center 102 that extends above underground tunnel 104. In some embodiments, vertical columns may be installed at intervals along either side of an underground networking tunnel to support a foundation of a data center constructed over the underground networking tunnel. In some embodiments, vertical columns, such as support pilings 132 and 134, may support a portion of a distributed load of a data center structure, such that the distributed load is not fully engaged upon a tunnel structure of an underground networking tunnel located under the data center.

In some embodiments, networking equipment, such as networking equipment in network equipment racks 140, may be commissioned prior to one or more electrical rooms at a data center location being commissioned. For example, power from a temporary connection to a local utility power provider or generator may be used to feed power to networking equipment in network equipment racks 140 prior to electrical power being made available from electrical rooms of a data center. In some embodiments, upon, or subsequent to, completion of an electrical room of a data center, networking equipment in an underground networking tunnel may be transitioned from the temporary power source to instead being fed electrical power from a power distribution panel of an electrical room of the data center. In some embodiments, an underground networking tunnel may include a primary power busway and reserve power busway that are fed primary and reserve power from an electrical room of a data center. The primary power busway and the reserve power busway may extend along a length of the underground networking tunnel and provide primary and reserve power to networking equipment mounted in network equipment racks of the underground networking tunnel, such as network equipment racks 140 of underground tunnel 104.

In some embodiments, an underground networking tunnel, such as underground tunnel 104, may include a cold aisle, such as cold aisle 138, and a hot aisle, such as hot aisle 136. In some embodiments, a modular infrastructure frame installed in an underground networking tunnel, such as underground tunnel 104, may include air containment partitions that separate air in the hot aisle from air in the cold aisle.

In some embodiments, cool air from a cold aisle of a computer room may be directed into a cold aisle of an underground networking tunnel via one or more ducts. For example, a floor grate in a cold aisle of a computer room may be connected to a ceiling vent of an underground networking tunnel via a supply duct between a bottom level of a data center and the underground networking tunnel. Also, air that has passed across heat producing components in the networking equipment mounted in the network equipment racks of the underground networking tunnel may be exhausted into a hot aisle, such as hot aisle 136. Exhaust air in the hot aisle of the underground networking tunnel may be directed into an exhaust plenum or return air plenum of the data center constructed above the underground networking tunnel via an exhaust or return air duct between the underground networking tunnel and the data center constructed above the underground networking tunnel.

In some embodiments, the exhaust air directed from the underground networking tunnel may be combined with exhaust air from other sources, such as other computer rooms, and may be exhausted to an external environment via air movers, such as air movers 126 and 128.

In some embodiments, a data center may have other cooling air supply and return/exhaust configurations and an underground networking tunnel may be provided cool air from a cooling supply system of a data center constructed above the underground networking tunnel and may return exhaust air to an exhaust air or return air system of the data center constructed above the underground tunnel structure. In some embodiments, prior to completion of a data center building being built above an underground networking tunnel, exhaust air may be directed into an empty building shell, or may be directed out of open ends of the underground networking tunnel, wherein the open ends lead to an external environment external to the underground networking tunnel and external to the data center being constructed above the underground networking tunnel.

Figure 1B:
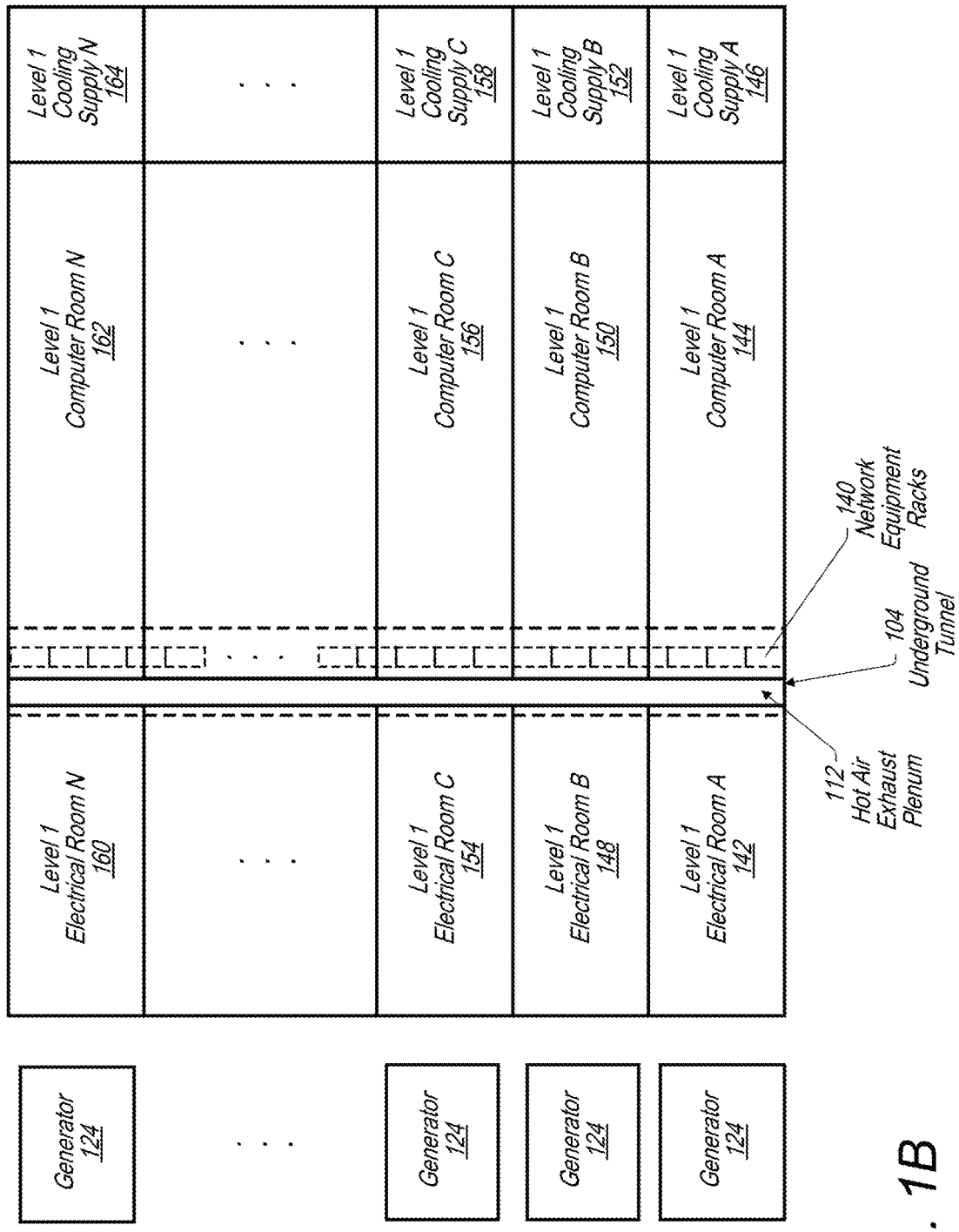
FIG. 1B illustrates a top view of a data center and an underground networking tunnel below the data center, according to some embodiments.

FIG. 1B illustrates a top view of a data center and an underground networking tunnel below the data center, according to some embodiments.

Level 1 of data center 102 is shown from a top view in FIG. 1B. Also, underground tunnel 104 is shown in hidden lines, because the underground tunnel 104 is under level 1 of data center 102. As can be seen in FIG. 1B, one or more levels of a data center, such as data center 102, may each comprise a plurality of computer rooms, electrical rooms, and cooling supply rooms. For example, level 1 of data center 102 includes electrical room A 142, computer room A 144, cooling supply room A 146, electrical room B 148, computer room B 150, cooling supply room B 152, electrical room C 154, computer room C 156, and cooling supply room 158. Additionally, level 1 of data center 102 includes any number of additional electrical rooms, computer rooms, and cooling supply rooms. For example, level 1 of data center 102 also includes electrical room N 160, computer room N 162, and cooling supply room N 164, wherein "N" represents any number of additional electrical rooms, computer rooms, or cooling supply rooms that may be included in a level of a data center.

In some embodiments, an underground networking tunnel, such as underground tunnel 104, may span a length or width of a data center, such as data center 102. Also, in some embodiments, a hot air exhaust plenum, such as hot air exhaust plenum 112, may span a length or width of a data center, such as data center 102. Additionally, a hot air exhaust plenum, such as hot air exhaust plenum 112, may span a height of a data center, such as data center 102. For example, a hot air exhaust plenum may span from a ground floor or first level of a data center to air moving devices, such as air movers 126 and 128, mounted on a roof of the data center.

As shown in FIG. 1B an underground networking tunnel, such as underground tunnel 104, may include a row of racks of networking devices, such as network equipment racks 140. On one side of the network equipment racks a cold aisle may be formed between a wall of the underground networking tunnel and the network equipment racks. On the other side of the network equipment racks a hot aisle may be formed between the opposite wall of the underground networking tunnel and the other side of the network equipment racks. Cold air from an air supply duct from a computer room above the underground networking tunnel may supply cool air into the cold aisle. The cool air may flow across the networking devices mounted in the network equipment racks, such as network equipment racks 140, and flow into a hot aisle on the other side of the network equipment racks. Exhaust air in the hot aisle may flow up through vents in a ceiling of the underground networking tunnel into a hot air exhaust plenum of a data center above the underground networking tunnel, such as hot air exhaust plenum 112 of data center 102.

Also as shown in FIG. 1B, an underground networking tunnel may overlap with a hot air exhaust plenum and computer rooms of a data center. For example, the hidden lines representing underground tunnel 104 which is below level 1 of data center 102 show that underground tunnel 104 extends below hot air exhaust plenum 112 and under an end portion of computer rooms 144, 150, 156, and 162. Because the underground tunnel extends beneath the computer rooms, a duct through a floor of one or more of the computer room may align with a cold aisle of the underground networking tunnel and direct cool air into the underground networking tunnel. Additionally, because the underground networking tunnel extends beneath a hot air exhaust plenum of the data enter, an exhaust duct in a ceiling of the underground networking tunnel may align with the hot air exhaust plenum and direct exhaust air from the underground networking tunnel into the hot air exhaust plenum.

In some embodiments, an underground networking tunnel may include as few as 50 network rack positions, or less, and in some embodiments an underground network tunnel may include as many as 300 network rack positions, or more.

Figure 1C:
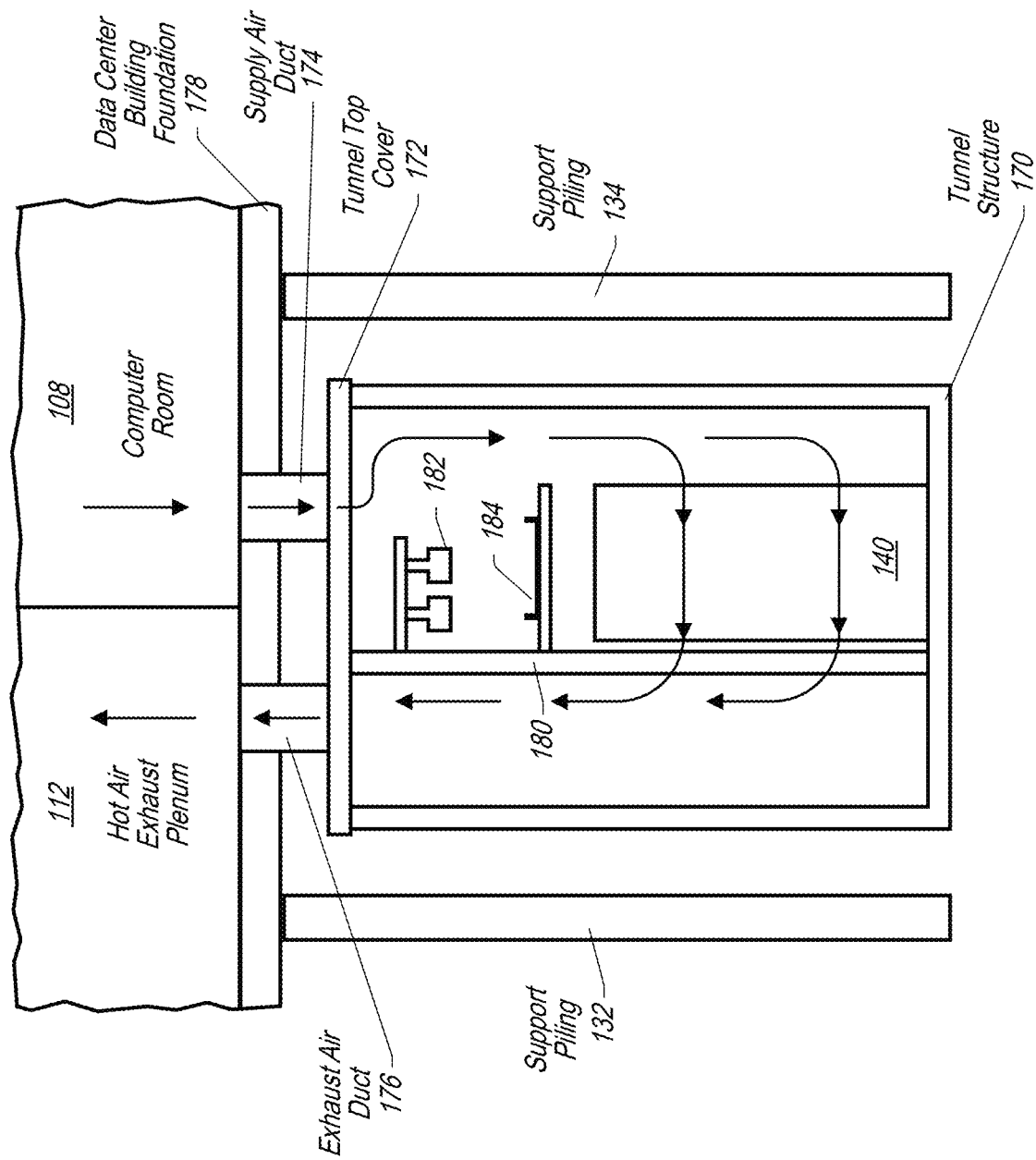
FIG. 1C illustrates a more detailed side view of an underground networking tunnel, according to some embodiments.

FIG. 1C illustrates a more detailed side view of an underground networking tunnel, according to some embodiments.

As discussed above, in some embodiments cooling air for an underground networking tunnel may be supplied from a computer room in a data center above the underground networking tunnel and exhaust air from the underground networking tunnel may be directed into an exhaust plenum of the data center located above the underground networking tunnel.

For example, FIG. 1C illustrates a more detailed view of an underground networking tunnel, such as underground tunnel 104. The underground networking tunnel includes a tunnel structure 170 and a tunnel top cover 172. Network equipment racks 140 are mounted in the tunnel structure 170. In some embodiments, power busways 182 and cable tray 184 may support network equipment racks 140. For example, power busways 182 may include a primary power busway and reserve power busway that supply primary and reserve power to networking equipment mounted in the network equipment racks 140. The primary power and reserve power may be fed to the primary power busway and reserve power busway from power distribution panels of an electrical room in the data center above the underground networking tunnel, such as from level 1 electrical room A 142. The cable trays 184 may support cables that connect the networking equipment to each other and to a larger provider network.

In some embodiments, a modular infrastructure frame, such as modular infrastructure frame 180, may support infrastructure system segments, such as segments of power busways 182 and cable trays 184. In some embodiments, infrastructure segments, such as segments of power busways 182 and cable trays 184 may be coupled to a modular infrastructure frame, such as modular infrastructure frame 180, prior to the modular infrastructure frame being delivered to a data center construction location. For example, in some embodiments, modular infrastructure frame 180 and one or more infrastructure system segments, such as segments of power busways 182 and cable trays 184 may be delivered to a data center construction location as a preassembled module.

In some embodiments, a modular infrastructure frame may include one or more additional infrastructure system segments, such as air containment panels, building management system sensors, fire suppression system components, very early smoke detection alarm system components, etc.

In some embodiments, vertical columns, such as support pilings 132 and 134 may support a portion of a weight of a data center constructed above an underground networking tunnel. For example, support pilings 132 and 134 support a portion of a load exerted downward by the data center building foundation 178 such that the weight of the data center is not pushing down on the tunnel top cover 172.

Also as shown in FIG. 1C, cool air may be supplied into the tunnel structure 170 from computer room 108 of data center 102 via supply air plenum 174 which passes through tunnel top cover 172. Also, as shown in FIG. 1C, exhaust air may be directed into vertical hot air exhaust plenum 112 from tunnel structure 170 via exhaust air plenum 176 which passes through tunnel top cover 172.

Figure 1D:
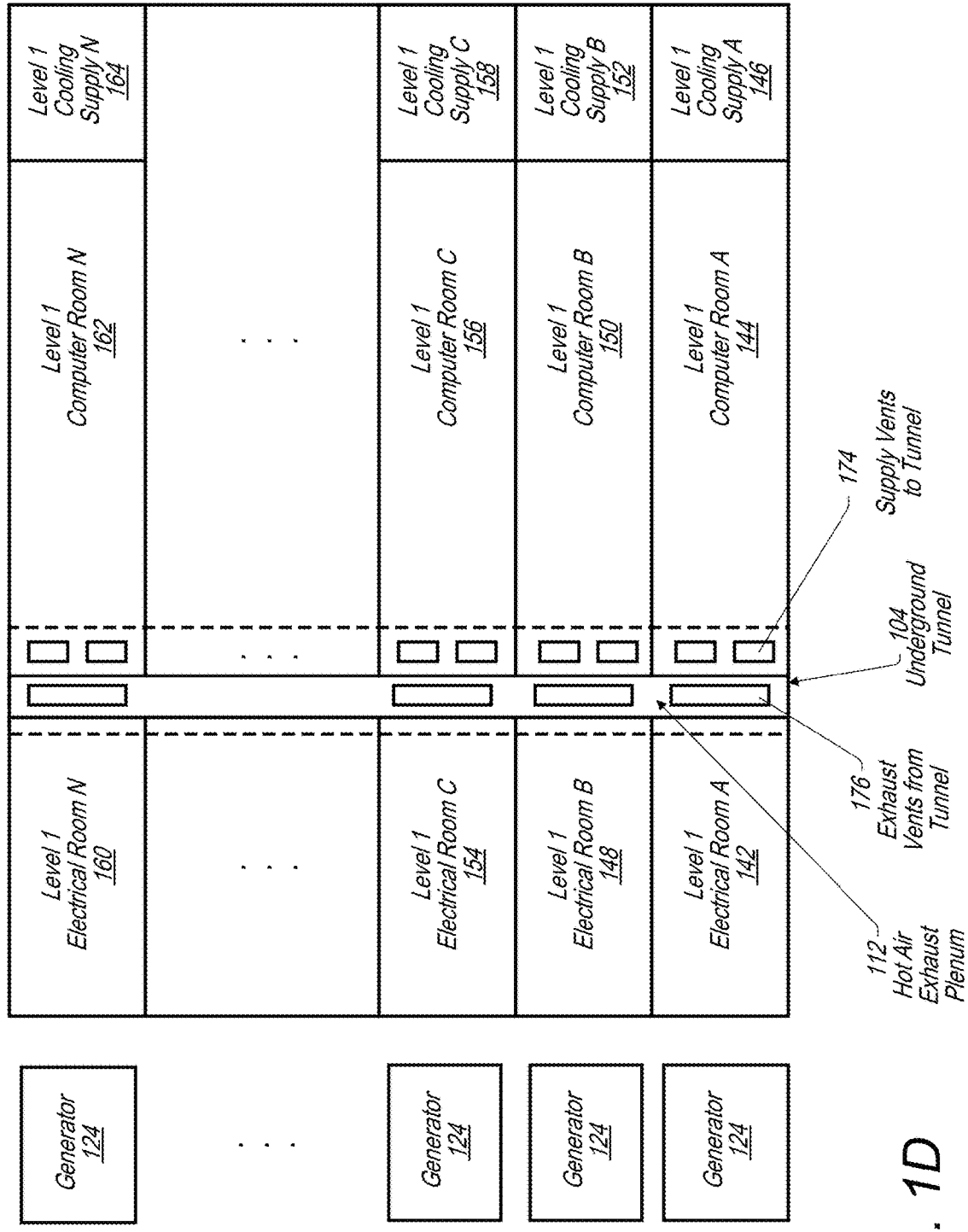
FIG. 1D illustrates a top view of a data center and an underground networking tunnel below the data center, wherein the figure shows air passages between the underground tunnel and the data center, according to some embodiments.

FIG. 1D illustrates a top view a data center and an underground networking tunnel below the data center, wherein the figure shows air passages between the underground tunnel and the data center, according to some embodiments.

In some embodiments, multiple supply air plenums and exhaust air plenums may allow air to be circulated through an underground networking tunnel to remove waste heat from networking equipment operating in the underground networking tunnel. For example, FIG. 1D shows a top view of level 1 of a data center, wherein supply air plenum 174 allow cooling air to pass from computer rooms 144, 150, 156, and 162 down into underground tunnel 104 and exhaust air plenum 176 allow exhaust air to be directed into hot air exhaust plenum 112.

In some embodiments, supply air plenum 174 and exhaust air plenum 176 may include grates in a floor of a first level of a data center. In some embodiments, supply air plenum 174 may be directly ducted to a cooling air supply plenum in computer rooms 144, 150, 156, and 162.

In some embodiments, exhaust air may be recycled back to a cooling supply room, such as one of cooling supply rooms 146 152, 158, or 164. In such embodiments, some or all of the exhaust air from the underground networking tunnel may be re-circulated or exhausted to an external environment, or some combination thereof.

Figure 2A:
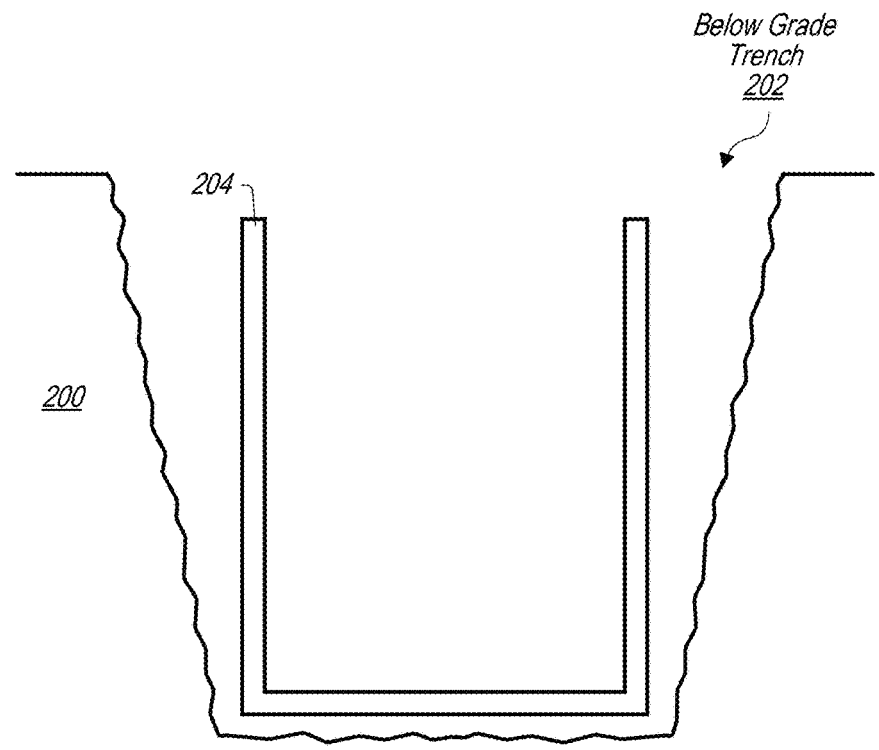
FIG. 2A illustrates a tunnel structure for an underground networking tunnel installed in a trench at a site where a data center is to be built, according to some embodiments.

FIG. 2A illustrates a tunnel structure for an underground networking tunnel installed in a trench at a site where a data center it to be built, according to some embodiments.

In FIG. 2A tunnel structure 204 is lowered into a below ground trench 202 at a site 200 where a data center is to be constructed. In some embodiments, the tunnel structure may be lowered into an excavated trench, such as trench 202, via a crane, or may be moved into an excavated trench via a backhoe, large forklift, or by other means. In some embodiments, a tunnel structure, such as tunnel structure 204, may be a pre-cast concrete culvert with an open end on the top of the concrete culvert. Also, in some embodiments (not shown), tunnel structure 204 may be a concrete culvert with a square or rectangular cross section without an open top side. In either embodiment, the tunnel structure, such as tunnel structure 204, may be open at either end of the tunnel structure, wherein the ends are at opposite ends of a length of the tunnel structure running parallel to the ground. For example, a worker may be able to enter and egress from the tunnel structure via the open ends of the tunnel structure.

Figure 2B:
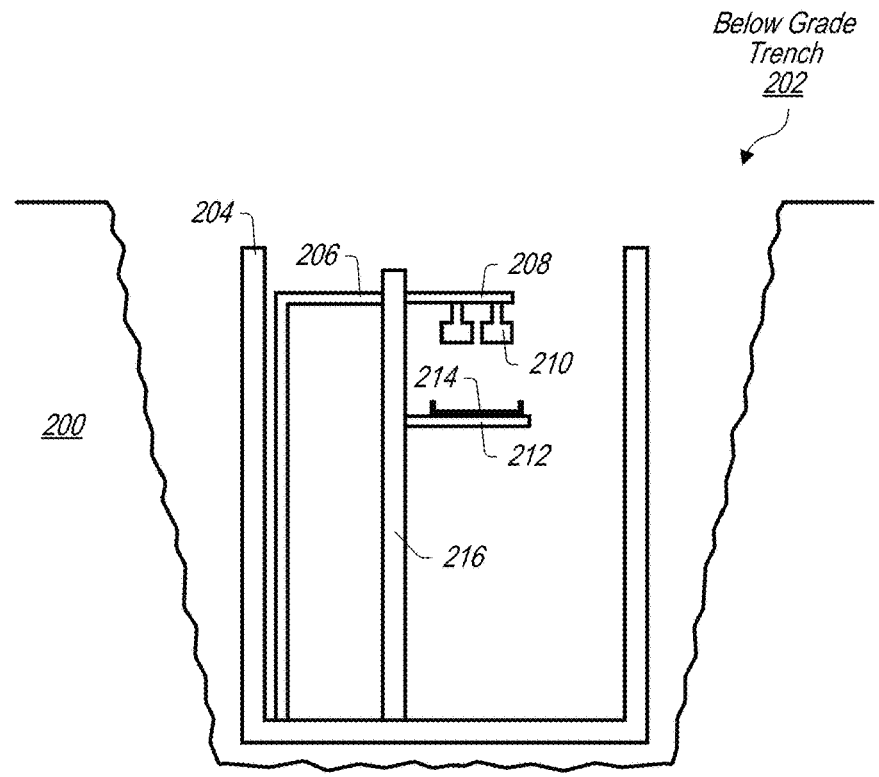
FIG. 2B illustrates a modular infrastructure frame and associated infrastructure system segments that have been installed in a tunnel structure for an underground networking tunnel, according to some embodiments.

FIG. 2B illustrates a modular infrastructure frame and associated infrastructure system segments that have been installed in a tunnel structure for an underground networking tunnel, according to some embodiments.

In FIG. 2B, modular infrastructure frame 206 has been installed in tunnel structure 204. In some embodiments modular infrastructure frame 206 may be lowered into tunnel structure 204 via an open top side of the tunnel structure 204 via a crane, or may be moved into the tunnel structure 204 via open ends of the tunnels structure, for example using a forklift.

In some embodiments, segments of infrastructure systems may be attached to modular infrastructure frame 206 prior to the modular infrastructure frame being delivered to a data center construction site, such as site 200. For example, the infrastructure system segments may be secured to supports of modular infrastructure frame 206 at an off-site assembly plant. In some embodiments, infrastructure system segments attached to a modular infrastructure frame, such as modular infrastructure frame 206, may include power busways 210 mounted to upper brace 208 of modular infrastructure frame 206 and cable tray 214 mounted on lower brace 212 of modular infrastructure frame 206. Additionally modular infrastructure frame 206 may include one or more vertical columns 216 and other horizontal frame members. In some embodiments air containment panels may be mounted to vertical columns 216. The air containment panels may prevent hot air in a hot aisle of tunnel structure 204 from mixing with cold air in a cold aisle of tunnel structure 204, but may allow exhaust air from networking equipment to pass into the hot aisle.

Figure 2C:
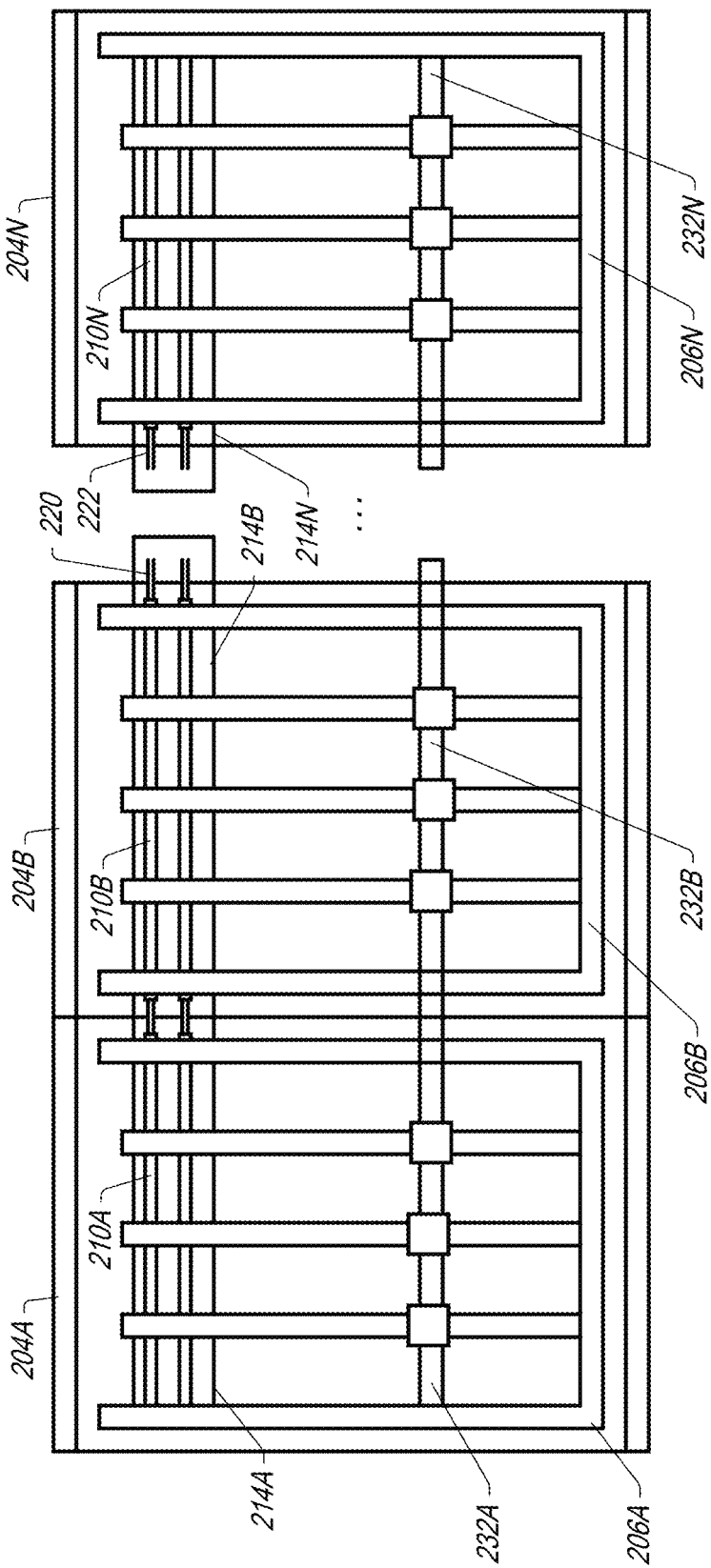
FIG. 2C illustrates a top view of a set of sections of tunnel structures for an underground networking tunnel and a set of modular infrastructure frames and associated infrastructure system segments that have been installed in the tunnel structures, according to some embodiments.

FIG. 2C illustrates a top view of a set of sections of tunnel structures for an underground networking tunnel and a set of modular infrastructure frames and associated infrastructure system segments that have been installed in the tunnel structures, according to some embodiments.

The top view shown in FIG. 2C illustrates tunnel structures 204A and 204B that are connected together. Also any number of additional tunnel structures 204N may be connected to tunnel structures 204A and 204B such that the connected tunnel structures span a length or width of a data center that is being built above the tunnel structures. In some embodiments, the tunnel structures 204A, 204B through 204N may include modular infrastructure frames 206A, 206B through 206N installed in the tunnel structures. Also, the modular infrastructure frames may include power busway segments 210A, 210B through 210N coupled to the modular infrastructure frames along with cable tray segments 214A, 214B through 214N and air containment panels 232A, 232B, through 232N coupled to the modular infrastructure frames.

In some embodiments, quick connects may facilitate connecting together segments of infrastructure systems pre-installed in modular infrastructure frames. For example, quick connects 220 and 222 may couple together power busway segments 210B and 210N. In some embodiments additional or alternative infrastructure system segments that may be included with a modular infrastructure frame, such as modular infrastructure frames 206A, 206B through 206N, may include low voltage power distribution, lighting, very early smoke detection alarm system components, cooling pipes, cooling return pipes, fire protection and suppression system components, building management system components, etc.

In some embodiments, the infrastructure frames and associated segments of infrastructure systems may be pre-integrated into a tunnel structure off-site from a data center or prior to installation at a data center location. For example, the tunnel structure may be installed already having the infrastructure frame and associated segments of infrastructure systems installed in the tunnel structure.

As can be seen in FIG. 2C connected tunnel structures 204A, 204B and 204N may be open on opposite ends of a length of the connected tunnel structures, and may include side walls on either end of a width of the tunnel structures. Also the tunnel structures may include a concrete floor and an open top side opposite the floor.

Figure 2D:
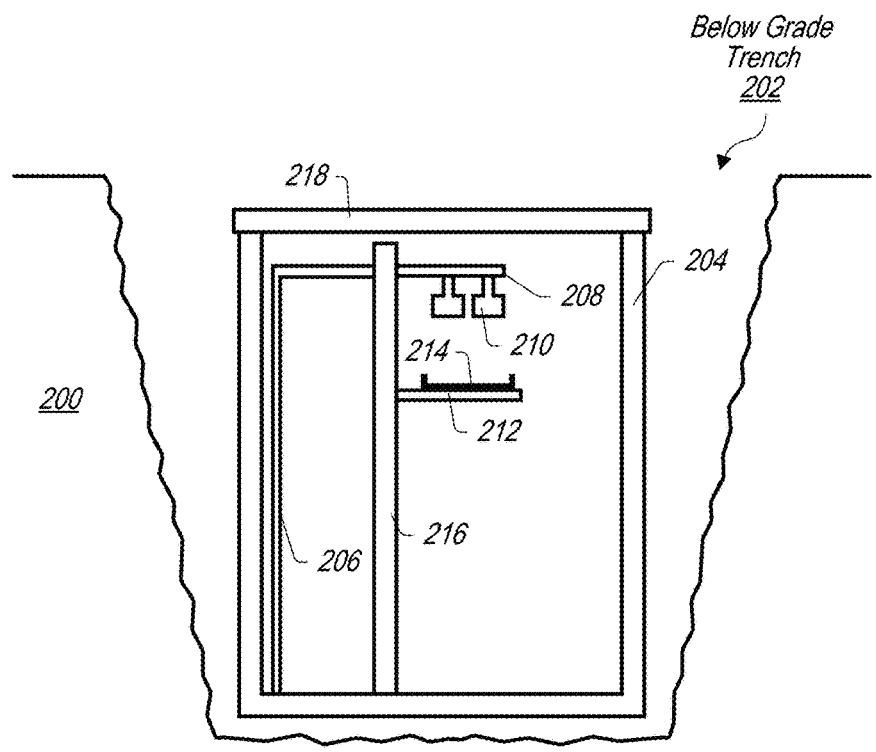
FIG. 2D illustrates a tunnel structure for an underground networking tunnel wherein a top cover has been placed on the tunnel structure, according to some embodiments.

FIG. 2D illustrates a tunnel structure for an underground networking tunnel wherein a top cover has been placed on the tunnel structure, according to some embodiments.

In some embodiments, after modular infrastructure frames are installed in a tunnel structure, a top cover may be placed on the tunnel structure. For example, in FIG. 2D top cover 218 has been installed on tunnel structure 204.

Figure 2E:
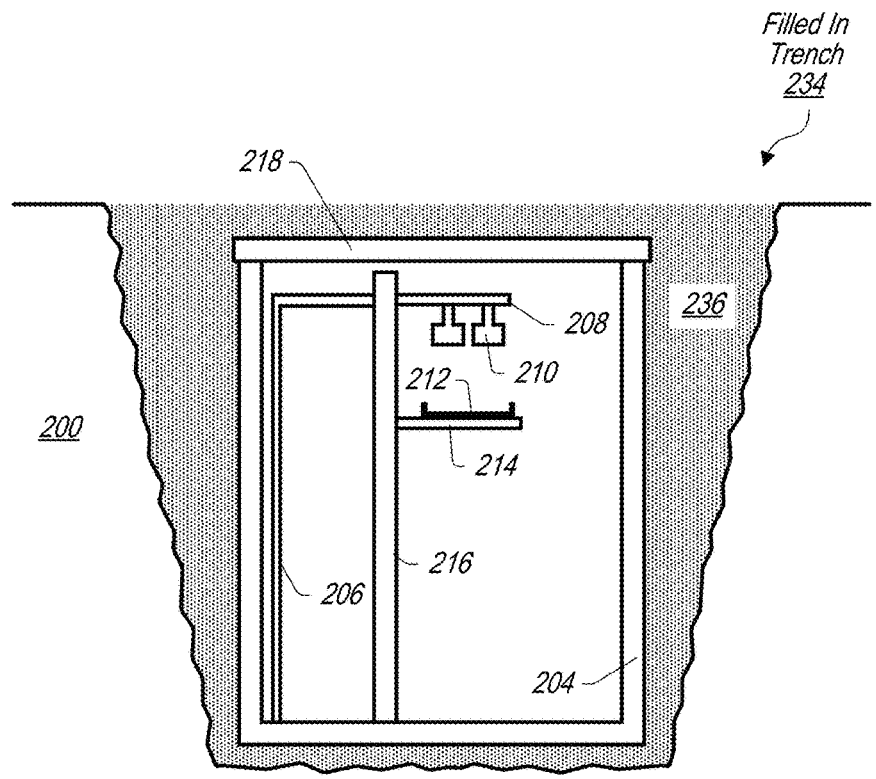
FIG. 2E illustrates spaces around and above a tunnel structure for an underground networking tunnel that have been filled with a filler material, such as dirt or sand, according to some embodiments.

FIG. 2E illustrates spaces around and above a tunnel structure for an underground networking tunnel that have been filled with a filler material, such as dirt or sand, according to some embodiments.

In some embodiments, after a top cover has been placed on a tunnel structure, any gaps around the tunnel structure and a space above the tunnel structure may be filled with a filler material, such as sand, dirt, or another type of filler. For example, in FIG. 2E below grade trench 202 has been filled with filler material 236 to form filled in trench 234.

Figure 2F:
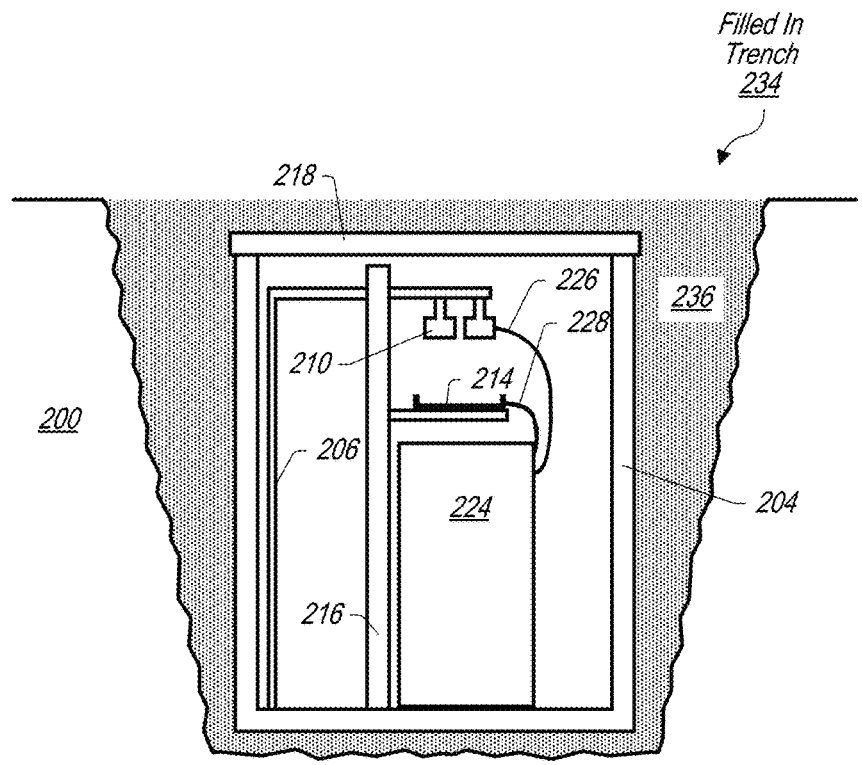
FIG. 2F illustrates networking equipment installed in a tunnel structure of an underground networking tunnel prior to construction of a data center building over the tunnel structure, according to some embodiments.

FIG. 2F illustrates networking equipment installed in a tunnel structure of a underground networking tunnel prior to construction of a data center building over the tunnel structure, according to some embodiments.

In some embodiments, subsequent to placing a top cover, such as top cover 218, on a tunnel structure, network equipment racks may be installed in the tunnel structure. For example FIG. 2F illustrates network equipment racks 224 installed in tunnel structure 204 and connected to power busways 210 via power connections 226. Also cables 228 from networking equipment in network equipment racks 224 are installed in cable tray 214.

Figure 2G:
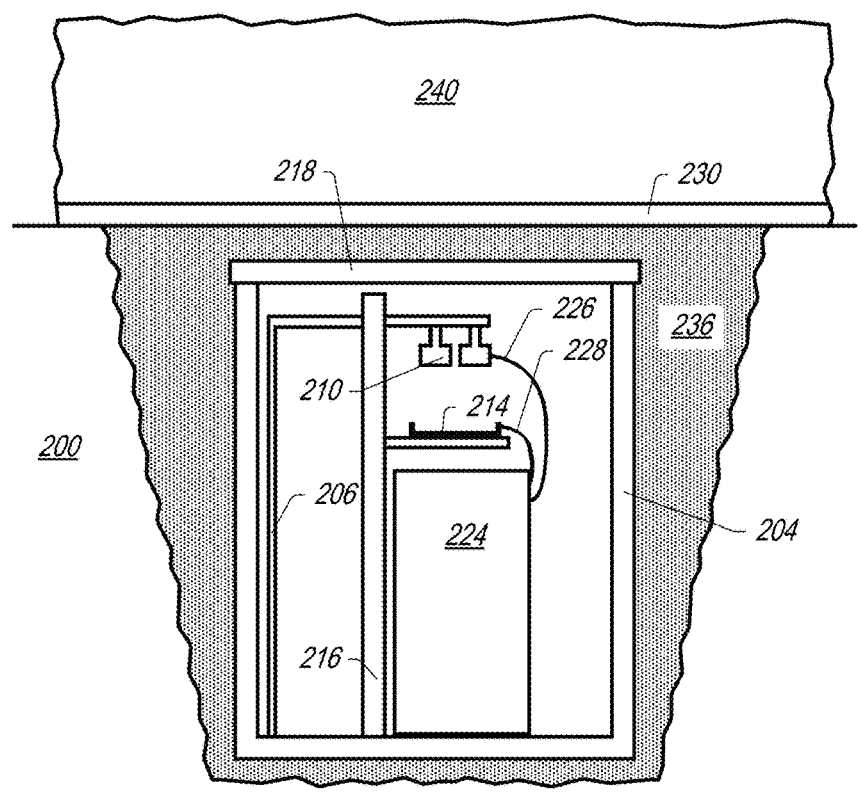
FIG. 2G illustrates a data center building that is being built or that has been built over an underground networking tunnel, according to some embodiments.

FIG. 2G illustrates a data center building that is being built or that has been built over an underground networking tunnel, according to some embodiments.

While networking equipment is being installed in network equipment racks 224, and while the networking equipment is being configured and a network for the data center is being commissioned and connected to a provider network, construction of data center 240 above the tunnel structure may proceed. For example, data center foundation 230 may be poured over filled in trench 234 that has been filled with filler material 236, while network commissioning work is performed by technicians in an underground networking tunnel such as in tunnel structure 204.

Figure 3:
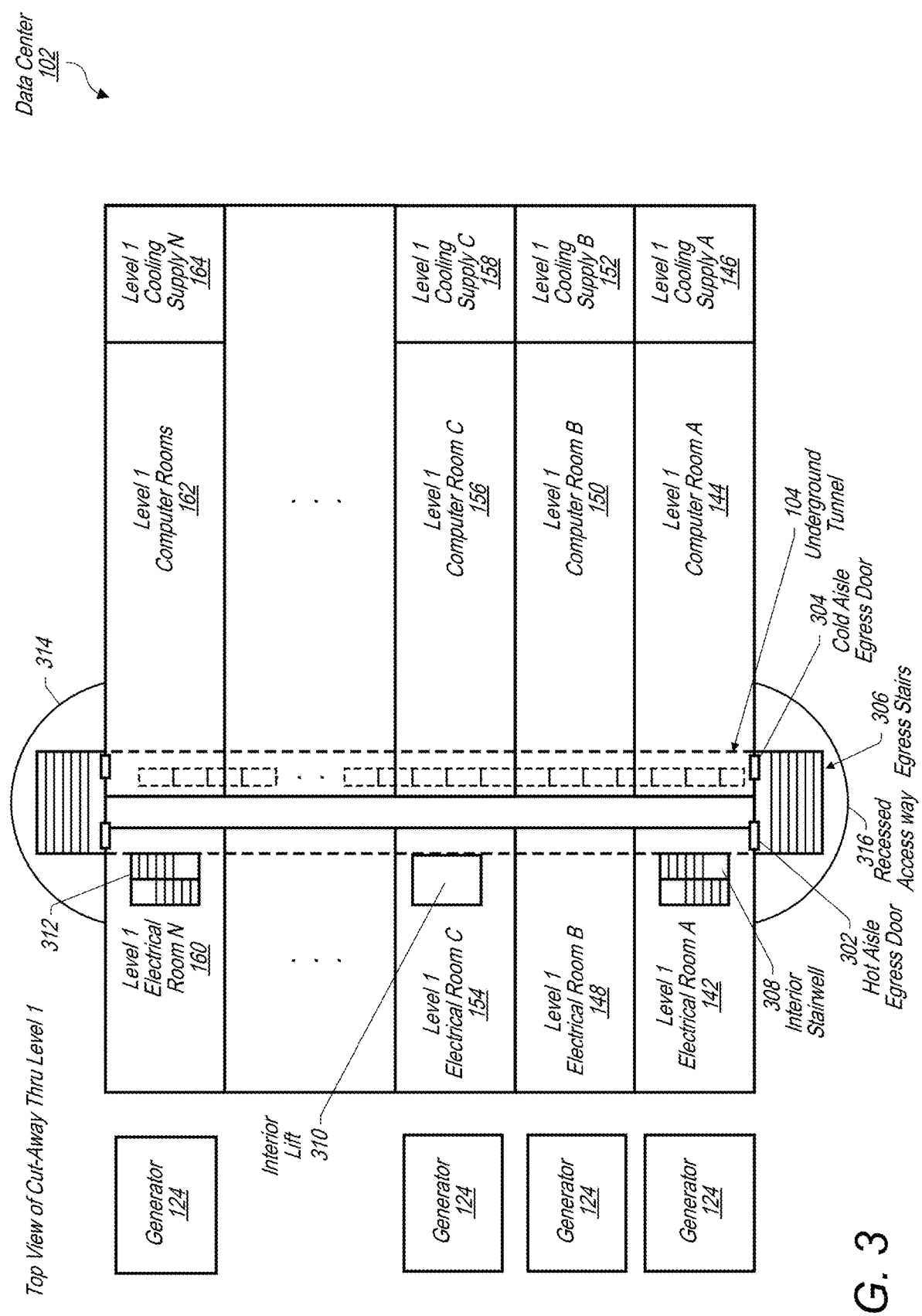
FIG. 3 illustrates a top view of a data center and an underground networking tunnel below the data center, wherein the figure shows egress points to an external environment from the underground networking tunnel, along with interior stairwells and an interior lift between the underground tunnel and the data center, according to some embodiments.

FIG. 3 illustrates a top view a data center and an underground networking tunnel below the data center, wherein the figures shows egress points to an external environment from the underground networking tunnel, along with interior stairwells and an interior lift between the underground tunnel and the data center, according to some embodiments.

In some embodiments, an underground networking tunnel, such as underground tunnel 104 or tunnel structures 204 coupled together to form an underground networking tunnel, may include egress points at either end of the underground networking tunnel. The underground networking tunnel may also include interior stairwells that allow egress to upper levels of a data center, such as data center 102, and a personnel and/or material lift that allows access to upper levels of the data center from the underground networking tunnel.

For example, underground tunnel 104 is connected to level 1 electrical room A 142 via interior stairwell 308. Also underground tunnel 104 is connected to level 1 electrical room N 160 via interior stairwell 312. Additionally, underground tunnel 104 is connected to one or more upper levels of data center 102, such as electrical room C 154 via interior lift 310.

Also, underground tunnel 104 includes hot aisle egress door 302 and cold aisle egress door 304 that lead to egress stairs 306 in recessed access way 316. In some embodiments, recessed access way may be an open air, open daylight, exit from the underground tunnel 104. Also, underground tunnel 104 has a corresponding recessed access way 314 on an opposite end of the underground tunnel, wherein recessed access way 314 can be accessed from underground tunnel 104 via another set of hot aisle and cold air egress doors and stairs. In some embodiments, underground tunnel 104 and data center 102 may be built on sloping land, such that there is a recessed access way, such as recessed access way 316, on one end of the tunnel and egress doors that open to a grade level (e.g. above ground) access way on the other end of the tunnel.

Figure 4:
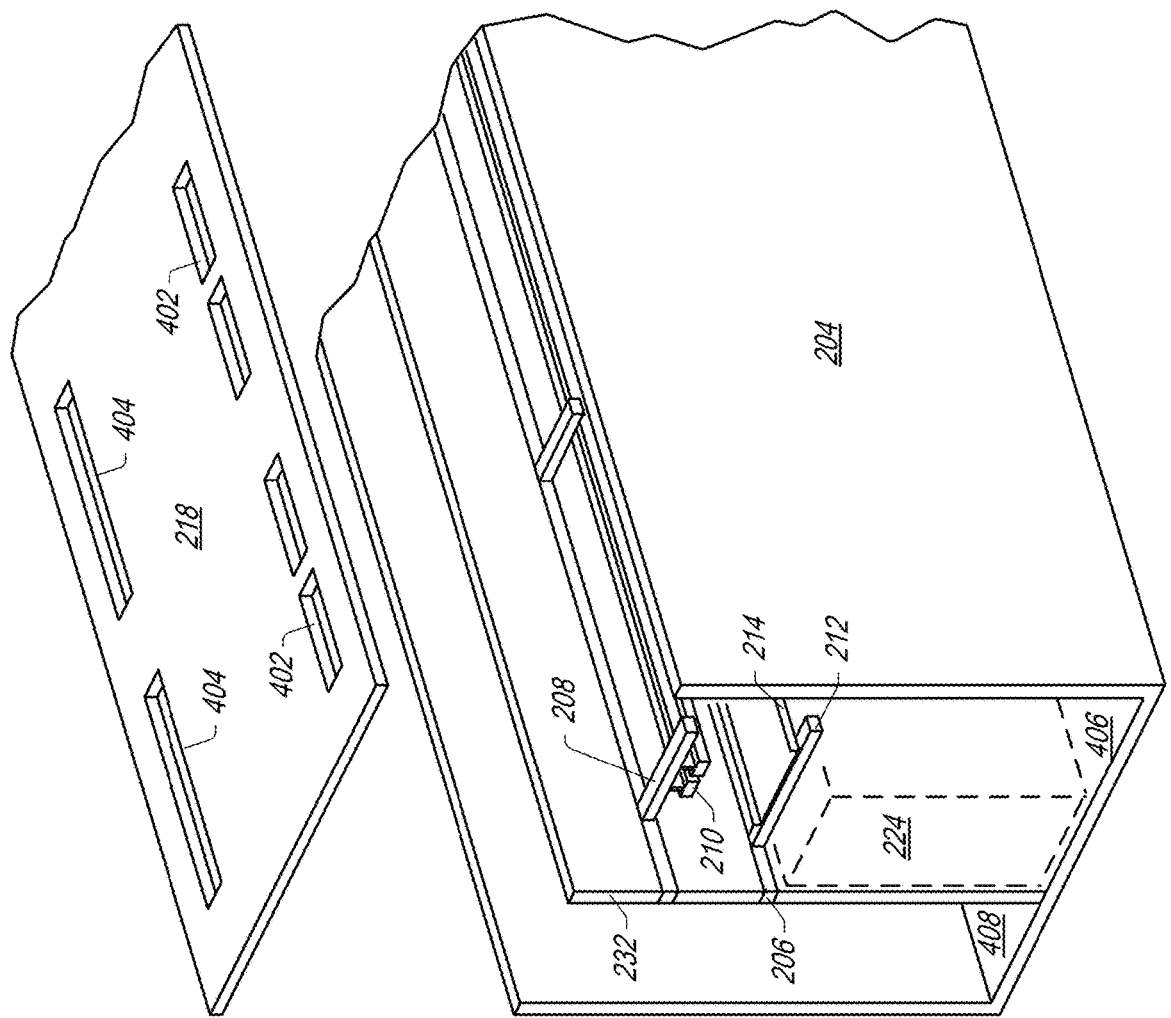
FIG. 4 illustrates a perspective view of a tunnel structure for an underground networking tunnel, wherein a modular infrastructure frame has been mounted in the tunnel structure. The figure also illustrates a perspective view of a top cover that mounts on the tunnel structure, according to some embodiments.

FIG. 4 illustrates a perspective view of a tunnel structure for an underground networking tunnel, wherein a modular infrastructure frame has been mounted in the tunnel structure. The figure also illustrates a perspective view of a top cover that mounts on the tunnel structure, according to some embodiments.

Tunnel structure 204 and top cover 218 illustrated in FIG. 4 may be the same as any of the tunnels structures and tunnel top covers described in FIGS. 1-3 and 7-9. Also similarly numbered components may be the same as the similarly numbered components illustrated in FIGS. 2A-G.

FIG. 4 illustrates modular infrastructure frame 206 installed in tunnel structure 204. The modular infrastructure frame includes upper brace 208 and lower brace 212. Upper brace 208 supports power busways 210 and lower brace 212 supports cable tray 214. Equipment racks 224 mount in tunnel structure 204 adjacent to modular infrastructure frame 206 and air containment panel 232 separates cold aisle 406 from hot aisle 408.

In some embodiments, top cover 208 includes supply ducts 402 that direct cold air into cold aisle 406 and also includes exhaust ducts 404 that direct exhaust air from hot aisle 408.

Example Environment with Multiple Availability Zones

In some embodiments, commissioning network equipment in a tunnel structure of a data center, may include setting up a local backbone network for the data center and integrating the local backbone network into a larger provider network. In some embodiments, integrating the local backbone network into the larger provider network may include configuring routers or other network equipment to communicate with the larger provider network, testing for vulnerabilities in the network, stress-testing the local backbone network, stress-testing connections from the local backbone network into the larger provider network, etc. In some embodiments, various other commissioning activities and testing may be performed.

Figure 5:
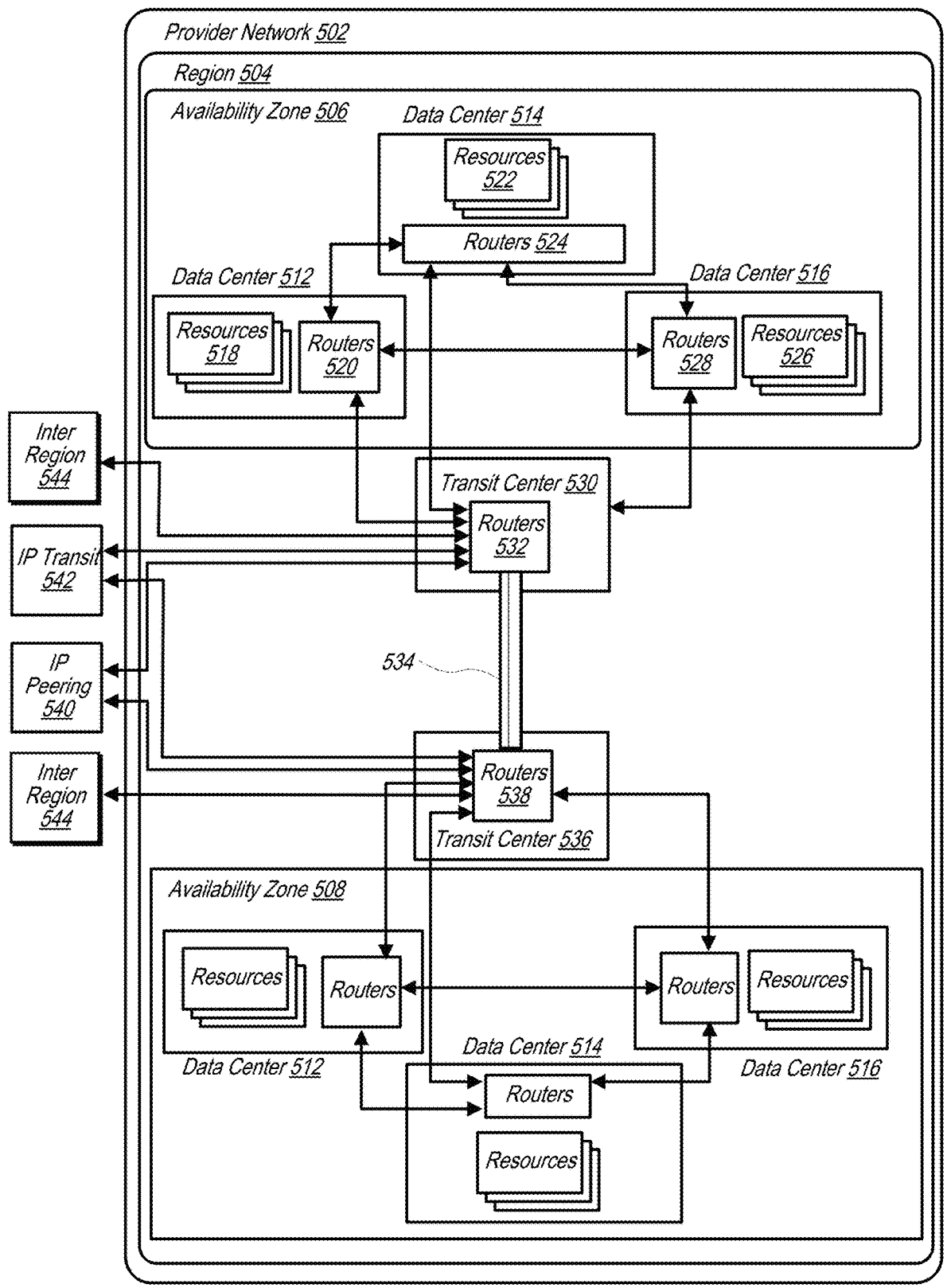
FIG. 5 illustrates a provider network that includes one or more data centers that may include an underground networking tunnel, according to some embodiments.

FIG. 5 illustrates a provider network that includes one or more data centers that may include an underground networking tunnel, according to some embodiments.

For example, FIG. 5 illustrates an example provider network into which a local backbone network in a tunnel structure of a data center may be integrated as part of commissioning network equipment in the tunnel structure of the data center. The provider network illustrated in FIG. 5 includes data centers in multiple availability zones in a region of the provider network. Any one of the data centers illustrated in FIG. 5 may be one of the data center described above in regard to FIGS. 1-4 and FIGS. 6-9, wherein the data center includes a tunnel structure and network equipment installed in the tunnel structure, and wherein the network equipment implements a local backbone network for the data center that is connected to a larger provider network, such as provider network 502.

A region of a provider network, such as provider network 502, may also include transit centers that connect the data centers to one another in an availability zone and that connects an availability zone to other availability zones in the region, as well as connecting the region to other regions and/or other networks, according to some embodiments.

Network 502 includes region 504 which includes availability zones 506 and 508. Region 504 includes two availability zones, however, a region of a provider network may include any number of availability zones. Each availability zone, may in turn include multiple data centers. For example availability zone 506 includes data centers 512, 514, and 516. Each data center may include resources, such as computing devices, storage devices, networking devices, and the like, along with one or more routers. In some embodiments, each of the data centers may include networking equipment that forms a local backbone network for the data center, such as networking equipment in a tunnel structure as described in FIGS. 1-4 and 7-9. For example data center 512 includes resources 518 and routers 520 (e.g. network equipment), data center 514 includes resources 522 and routers 524 (e.g. network equipment), and data center 516 includes resources 526 and routers 528 (e.g. network equipment). In some embodiments, an availability zone may be connected to a transit center, such as transit center 530, and a transit center, such as transit center 530, may include one or more routers, such as routers 532. Intra-region backbone paths may provide a physical connection path between routers in each of data centers 512, 514, 516, and transit center 530. In addition, a transit center, such as transit center 530, may be connected to other transit centers via an intra-region backbone path, such as backbone path 534 between a router of the transit center, such as router 532 of transit center 530, and a router of another transit center, such as router 538 of transit center 536.

In addition, a transit center may be connected to other networks via an IP peering arrangement, such as IP peering 540 or may be connected to an IP transit provider, such as IP transit 542. Also, a transit center may be connected to other regions of a provider network via inter-region backbone paths, such as inter-region paths 544.

In some embodiments, a provider network, such as network 502, may include multiple regions 504 spread out across the country or the world.

Example Environment with Multiple Regions

Figure 6:
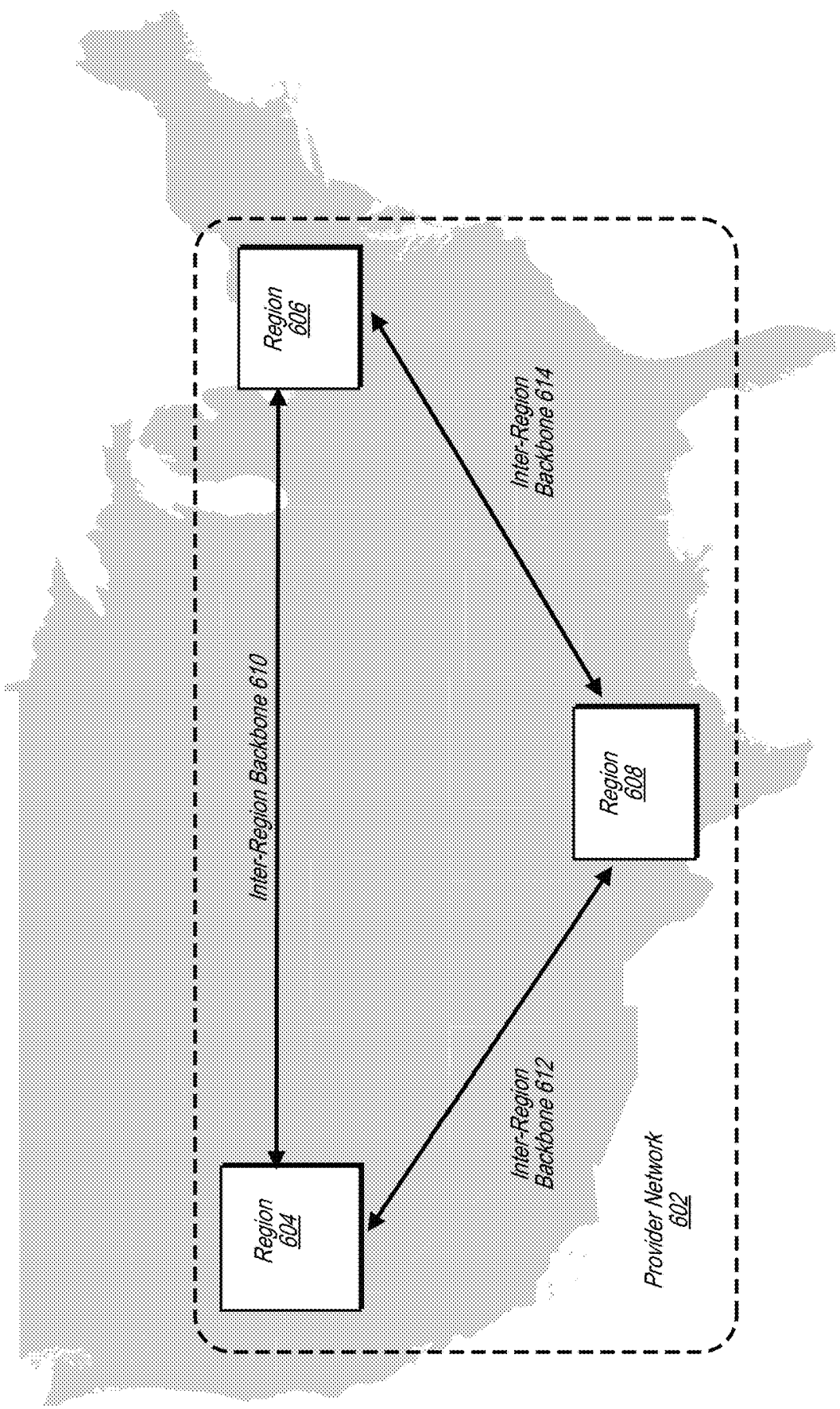
FIG. 6 illustrates a multi-region provider network that includes one or more data centers that may include an underground networking tunnel, according to some embodiments.

FIG. 6 illustrates a multi-region provider network that includes one or more data centers that may include an underground networking tunnel, according to some embodiments. For example, FIG. 6 illustrates a provider network that includes inter-region backbone paths, such as inter-region backbone paths 544, between regions of the provider network, according to some embodiments.

Provider network 602 includes regions 604, 606, and 608. Inter-region backbone paths 610, 612, and 614 connect regions 604, 606, and 608. Each of regions 604, 606, and 608 may be a region such as region 504 illustrated in FIG. 5.

In some embodiments, commissioning a local backbone network of a data center being constructed, wherein the local backbone network is implemented via network equipment in at tunnel structure, as described herein, may include integrating the local backbone network into a local availability zone, region, and across regions, such as the regions illustrated in FIG. 6. Such commissioning may take several weeks or a month or more to complete. However, as described above, by utilizing a tunnel structure, such commissioning work can be performed in parallel with construction of the data center above the tunnel structures, such that the network may be ready for use at or near the time of completion of construction of the data center.

Example Methods of Installing/Commissioning an Underground Networking Tunnel

Figure 7:
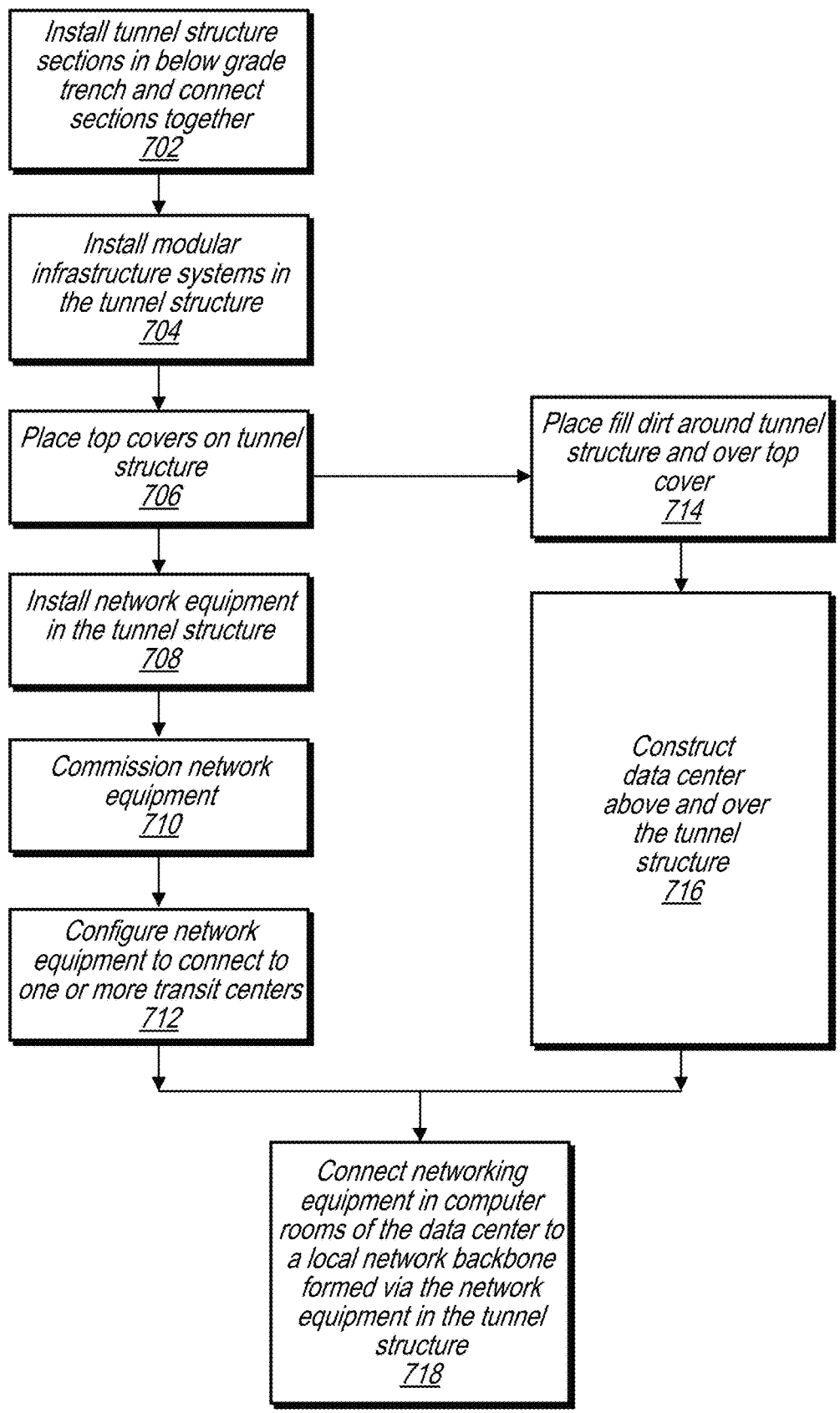
FIG. 7 illustrates a flowchart for implementing an underground networking tunnel at a data center location, according to some embodiments.

FIG. 7 illustrates a flowchart for implementing an underground networking tunnel at a data center location, according to some embodiments.

At 702, tunnel structure sections are installed in a below grade trench at a data center construction site and the tunnel structure segments are connected together in the trench. In some embodiments, support pilings, such as support pilings 132 and 134, may be installed or constructed on either side of the tunnel structure.

At 704, modular infrastructure systems, such as modular infrastructure frames, are installed in the connected tunnel structure segments.

At 706, one or more top covers are placed on the tunnels structure segments.

At 708, network equipment, such as servers, data storage devices, routers, cabling, fiber, etc. is installed in the tunnel structure.

At 710, the network equipment in the tunnel structure is commissioned and at 712 the network equipment is connected to one or more transit centers of a provider network. Connecting the network equipment to the transit centers and commissioning a local backbone network for the data center may include configuring network settings, configuring network routing tables, testing the network for robustness and vulnerabilities, and other commissioning activities.

While 708-712 are being performed, at 714 fill dirt may be placed over the tunnel structures that has been covered with the top covers, and at 716 a data center may be constructed over the underground networking tunnel.

At 718, after the data center has been constructed, the commissioned network in the underground networking tunnel may be connected to computing devices and/or data storage devices installed in computer rooms of the data center, wherein the networking equipment in the underground networking tunnel forms a local network backbone for the data center.

Figure 8A:
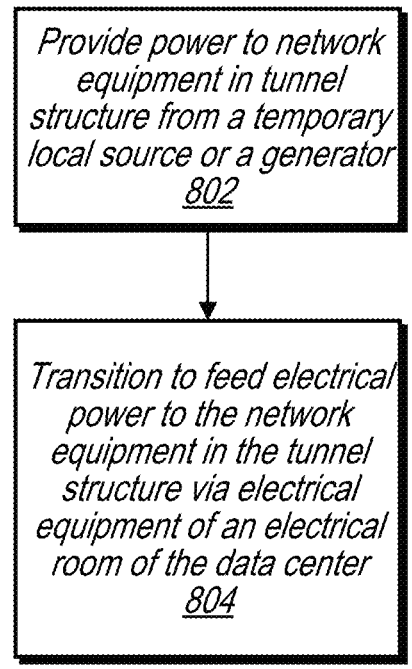
FIG. 8A illustrates a flowchart for providing power to network equipment in an underground networking tunnel at a data center location, according to some embodiments.

FIG. 8A illustrates a flowchart for providing power to network equipment in an underground networking tunnel at a data center location, according to some embodiments.

At 802, power is provided to network equipment in an underground networking tunnel from a temporary local power source, such as a local utility power connection and/or a generator. In some embodiments, commissioning of network equipment in an underground networking tunnel may be performed prior to installation of permanent electrical equipment at a data center construction site. Thus, it may be necessary to use a temporary connection to a local power utility or a generator to provide power to the networking equipment.

At 804, once permanent electrical equipment has been installed in the data center under construction and has been commissioned, the networking equipment in the underground networking tunnel may be transitioned to instead receive electrical power from electrical equipment in an electrical room of the data center, such as a power distribution panel of the electrical room. In some embodiments, the electrical power may be fed to the networking equipment via a primary and/or a reserve power busway. The reserve power busway may provide reserve power to the networking equipment in the event of a loss of power from the primary power busway.

Figure 8B:
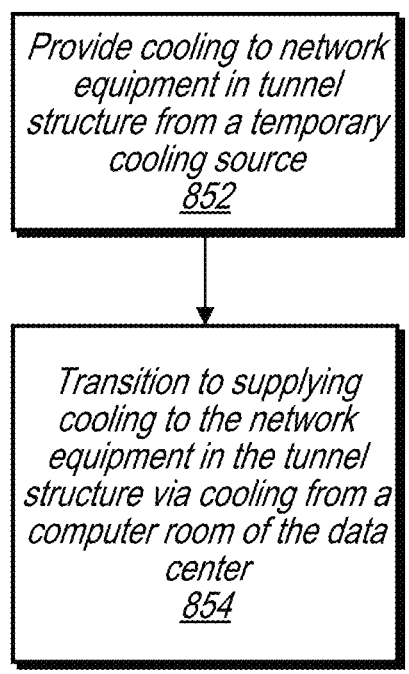
FIG. 8B illustrates a flowchart for providing cooling to network equipment in an underground networking tunnel at a data center location, according to some embodiments.

FIG. 8B illustrates a flowchart for providing cooling to network equipment in an underground networking tunnel at a data center location, according to some embodiments.

In a similar manner as to power, cooling may also be provided to network equipment in an underground tunnel from a temporary local source. For example, at 852 cooling is supplied to network equipment in the tunnel structure from a temporary cooling source. In some embodiments, the temporary cooling source may be a portable chiller, fan, or other type of portable cooling device that blows cool air into the underground tunnel from an open end of the tunnel. Also, cooling air that has passed across heat producing components in the networking equipment in the tunnel may be exhausted via another open end of the underground tunnel. Also, cooling air that has passed across heat producing components in the networking equipment in the tunnel may be exhausted vertically out of the underground tunnel into a data center building structure that is under construction.

At 854, the underground tunnel is transitioned to being supplied cooling from a data center building being built above the underground tunnel. For example, upon installation of cooling equipment in the data center, the temporary cooling equipment at the open end of the tunnel may be removed and the underground tunnel may be transitioned to receiving cooling air from a data center cooling system, such as a duct that connects to a cold aisle of a computer room.

Figure 9:
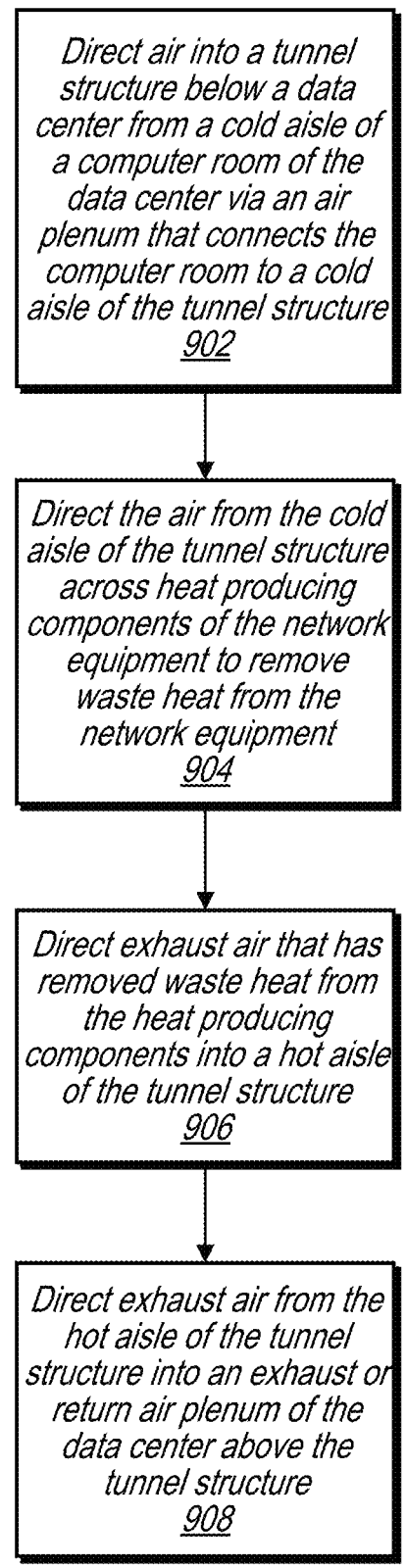
FIG. 9 illustrates a flowchart for cooling network equipment in an underground networking tunnel at a data center location, according to some embodiments.

FIG. 9 illustrates a flowchart for cooling network equipment in an underground networking tunnel at a data center location, according to some embodiments.

At 902 air is directed into a tunnel structure below a data center from a cold aisle of a computer room of the data center. The air is directed via a supply duct running from the computer room through a top cover for the tunnel structure and into an underground networking tunnel. The air may be directed into a cold aisle of the underground networking tunnel.

At 904 the air is directed from the cold aisle of the tunnel structure across heat producing components of the network equipment to remove waste heat from the network equipment.

At 906, exhaust air that has removed waste heat from heat producing components of the network equipment is directed into a hot aisle of the underground networking tunnel.

At 908, exhaust air in the hot aisle is directed into an exhaust air plenum of the data center constructed above the underground networking tunnel via an exhaust air duct that passes through a top cover for a tunnel structure of the underground networking tunnel. In some embodiments, the exhaust air may be directed into a return air duct that re-conditions the air and supplies the air to a cold aisle of one or more of the computer rooms of the data center. In some embodiments, the exhaust air may be exhausted into an external environment.

Illustrative Computer System

Figure 10:
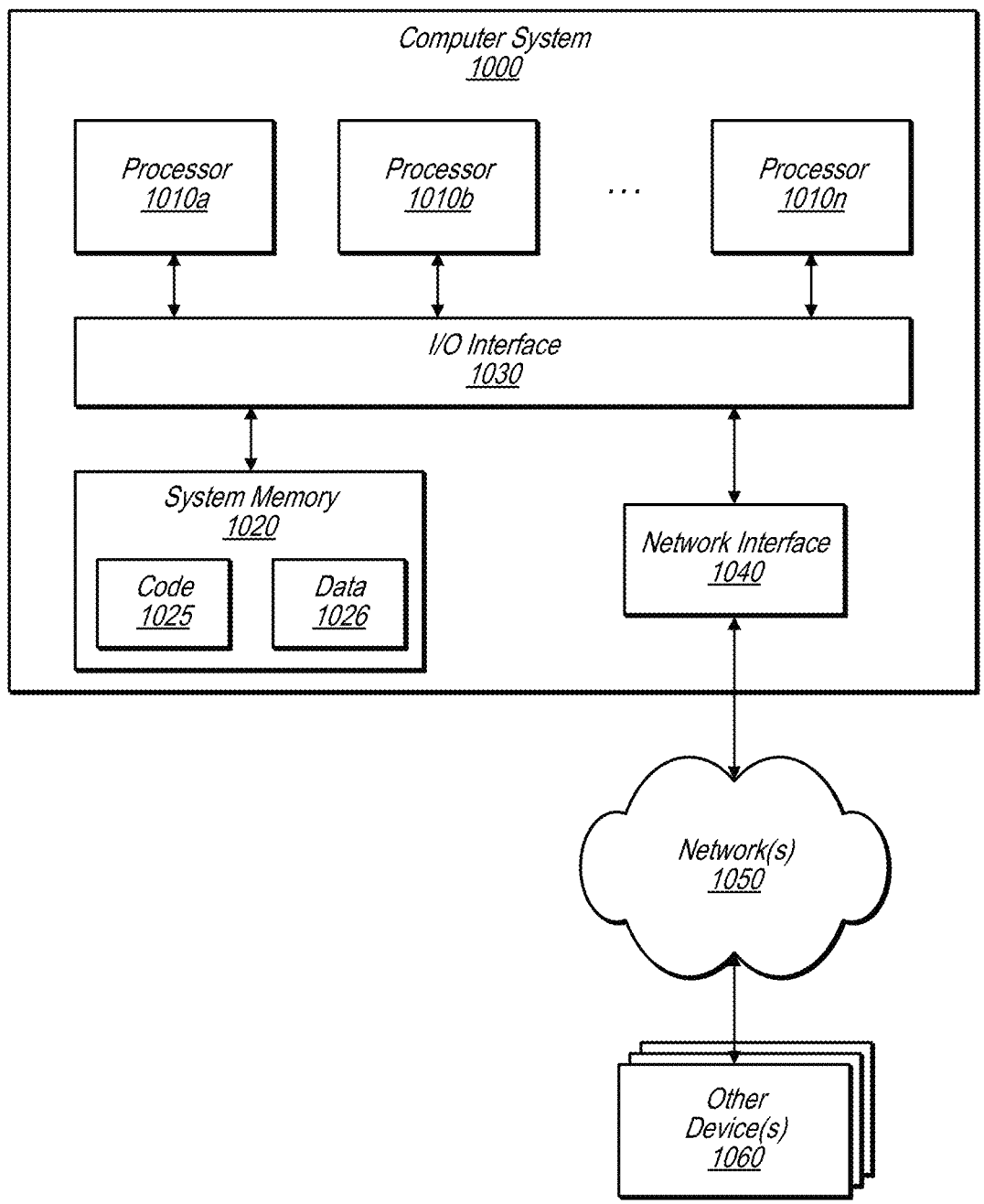
FIG. 10 illustrates a block diagram for an example computer system that may be used in some embodiments.

FIG. 10 illustrates a block diagram for an example computer system that may be used in some embodiments.

In at least some embodiments, a piece of network equipment, router, or server that implements a portion or all of one or more of the technologies described herein, including the techniques to implement and commission a local network backbone for a data center, may include a general-purpose computer system that includes or is configured to access one or more computer-accessible media, such as computer system 1000 illustrated in FIG. 10. In the illustrated embodiment, computer system 1000 includes one or more processors 1010 coupled to a system memory 1020 via an input/output (I/O) interface 1030. Computer system 1000 further includes a network interface 1040 coupled to I/O interface 1030.

In various embodiments, computer system 1000 may be a uniprocessor system including one processor 1010, or a multiprocessor system including several processors 1010 (e.g., two, four, eight, or another suitable number). Processors 1010 may be any suitable processors capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 1010 may commonly, but not necessarily, implement the same ISA.

System memory 1020 may be configured to store instructions and data accessible by processor(s) 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as those methods, techniques, and data described above, are shown stored within system memory 1020 as code 1025 and data 1026.

In one embodiment, I/O interface 1030 may be configured to coordinate I/O traffic between processor 1010, system memory 1020, and any peripheral devices in the device, including network interface 1040 or other peripheral interfaces. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. Also, in some embodiments some or all of the functionality of I/O interface 1030, such as an interface to system memory 1020, may be incorporated directly into processor 1010.

Network interface 1040 may be configured to allow data to be exchanged between computer system 1000 and other devices 1060 attached to a network or networks 1050, such as other computer systems or devices, such as network equipment, routers, and other computing devices, as illustrated in FIGS. 1 through 9, for example. In various embodiments, network interface 1040 may support communication via any suitable wired or wireless general data networks, such as types of Ethernet network, for example. Additionally, network interface 1040 may support communication via telecommunications/telephony networks such as analog voice networks or digital fiber communications networks, via storage area networks such as Fibre Channel SANs, or via any other suitable type of network and/or protocol.

In some embodiments, system memory 1020 may be one embodiment of a computer-accessible medium configured to store program instructions and data as described above for FIGS. 1 through 9 for implementing embodiments of methods and apparatus for commissioning a local network backbone for a data center. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 1000 via I/O interface 1030. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computer system 1000 as system memory 1020 or another type of memory. Further, a computer-accessible medium may include transmission media or signals such as electrical, electromagnetic, or digital signals, conveyed via a communication medium such as a network and/or a wireless link, such as may be implemented via network interface 1040.

The various methods as illustrated in the figures and described herein represent example embodiments of methods. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method of commissioning a network at a data center, the method comprising:
    installing a tunnel structure below a ground level at a location;
    installing networking equipment in the tunnel structure before or while a data center building is being constructed above the tunnel structure at the location;
    commissioning the networking equipment installed in the tunnel structure while the data center building is being constructed above the tunnel structure;
    connecting the networking equipment that has been commissioned in the tunnel structure to one or more computer rooms of the data center building, wherein the commissioned networking equipment installed in the tunnel structure provides a local network backbone for the network at the data center; and
    connecting the tunnel structure and the data center building such that a cooling system in the data center building is configured to provide cooling to remove waste heat from the networking equipment installed in the tunnel structure,
    wherein at least a portion of the commissioning is performed before the computer rooms of the data center building are commissioned.

2. The method of claim 1, further comprising:
    installing modular infrastructure frames in the tunnel structure, wherein segments of one or more infrastructure systems configured to provide infrastructure support to the networking equipment installed in the tunnel structure are coupled to the modular infrastructure frames.

3. The method of claim 2, wherein:
    the tunnel structure comprises one or more open ends;
    the modular infrastructure frames are transported into the tunnel structure via the one or more open ends; and
    the modular infrastructure frames are connected together via respective connections of the segments of the one or more infrastructure systems that are coupled to the modular infrastructure frames.

4. The method of claim 2, wherein:
    the tunnel structure comprises an open top side;
    the modular infrastructure frames are lowered into the tunnel structure via the open top side; and
    the modular infrastructure frames are connected together via respective connections of the segments of the one or more infrastructure systems that are coupled to the modular infrastructure frames.

5. The method of claim 4, further comprising:
    installing a top cover on the open top side of the tunnel structure;
    filling open spaces on sides of the tunnel structure or above the top cover with a fill material; and
    constructing the data center building over the tunnel structure and the top cover.

6. The method of claim 1, further comprising:
    initiating the commissioning the networking equipment installed in the tunnel structure prior to completion of construction of a data center comprising the data center building, wherein the data center building is being constructed above the tunnel structure.

7. The method of claim 6, comprising:
    providing power to the networking equipment installed in the tunnel structure from a temporary connection to a local power source or a generator; and
    after completion of construction of an electrical room of the data center, transitioning the networking equipment installed in the tunnel structure to receive power via electrical equipment mounted in the electrical room of the data center.

8. The method of claim 6, comprising:
    after completion of construction of a computer room of the data center,
        directing cooling air from the computer room into the tunnel structure to remove waste heat from the networking equipment installed in the tunnel structure; and
        directing exhaust air that has removed waste heat from the networking equipment installed in the tunnel structure into an exhaust plenum of the data center.

9. The method of claim 6, wherein installing the tunnel structure comprises:
    installing a set of pre-fabricated concrete tunnel structures in an excavated trench; and
    connecting the set of pre-fabricated concrete tunnel structures together to form the tunnel structure in the trench.

10. The method of claim 9, wherein the set of pre-fabricated concrete tunnel structures comprises a quantity of pre-fabricated concrete tunnel structures such that the connected set of concrete tunnel structures spans a length or width of the data center building.

11. The method of claim 10, further comprising:
    installing modular infrastructure frames in the tunnel structure via an open top side of the pre-fabricated concrete tunnel structures, wherein segments of one or more infrastructure systems are coupled to the modular infrastructure frames; and
    connecting together the segments of the one or more infrastructure systems via respective connections of the segments of the one or more infrastructure systems such that the one or more infrastructure systems are configured to provide infrastructure support to the networking equipment to be installed in the tunnel structure.

12. The method of claim 11, further comprising:
    installing pre-fabricated concrete top cover sections on respective ones of the set of pre-fabricated concrete tunnel structures; and
    filling gaps around the set of pre-fabricated concrete tunnel structures and gaps over the concrete top cover sections with a filler material.

13. The method of claim 11, further comprising:
    installing the networking equipment in the tunnel structure; and
    connecting the networking equipment to a provider network of an operator of the data center, wherein said installing and said connecting are performed while the data center building is being constructed above the tunnel structure.

14. The method of claim 9, wherein the set of prefabricated concrete tunnel structures are installed with modular infrastructure frames pre-integrated into the prefabricated concrete tunnel structures.

15. The method of claim 1, wherein the data center building is part of a data center facility comprising:
the data center building comprising a plurality of computer rooms;
the tunnel structure extending below the data center building; and
the networking equipment installed in the tunnel structure.

16. The method of claim 15, wherein the networking equipment forms a network backbone for the data center and connects computing devices in the plurality of computer rooms of the data center to a provider network of an operator of the data center.

17. The method of claim 15, further comprising:
installing support columns on opposing sides of the tunnel structure, wherein the support columns support a weight of a portion of the data center building that is above the tunnel structure.

18. The method of claim 15, wherein the data center building comprises an electrical room and electrical equipment mounted in the electrical room, and
wherein the networking equipment installed in the tunnel structure is supplied primary power and reserve power via a primary power busway and a reserve power busway connected to respective primary and reserve power systems that are fed primary and reserve power from the electrical equipment mounted in the electrical room of the data center building.

19. The method of claim 15, further comprising:
installing a supply duct configured to direct cooling air from a computer room of the data center building into the tunnel structure via an opening in a top cover for the tunnel structure; and
installing a return air duct configured to direct exhaust air from the tunnel structure into an exhaust plenum of the data center via another opening in the top cover for the tunnel structure.

20. The method of claim 15, further comprising:
installing an interior stairwell that provides access to and egress from the tunnel structure to the data center building above the tunnel structure; or
installing a material lift configured to move materials or passengers between the tunnel structure and one or more levels of the data center building above the tunnel structure.

21. The method of claim 15, wherein an end of the tunnel structure provides an egress point to an external environment external to the tunnel structure and external to the data center building.

* * * * *